US006859768B1

(12) United States Patent
Wakelam et al.

(10) Patent No.: US 6,859,768 B1
(45) Date of Patent: Feb. 22, 2005

(54) COMPUTER-IMPLEMENTED AUTOMATED BUILDING DESIGN AND MODELING AND PROJECT COST ESTIMATION AND SCHEDULING SYSTEM

(75) Inventors: Robert Bruce Wakelam, Dallas, TX (US); Henry C. (Peter) Beck, III, Dallas, TX (US); Bradley Paul Phillips, Mesquite, TX (US); Gregory Wayne Powell, Ben Wheeler, TX (US); Niall Brendan O'Kelly, Marden (GB)

(73) Assignee: The Beck Technology, Dallas, TX (US)

( * ) Notice: Subject to any disclaimer, the term of this patent is extended or adjusted under 35 U.S.C. 154(b) by 0 days.

(21) Appl. No.: 09/518,697

(22) Filed: Mar. 3, 2000

(51) Int. Cl.[7] .......................... G06F 17/50; G06F 17/60
(52) U.S. Cl. ............................................. 703/1; 705/10
(58) Field of Search ................................ 703/1; 705/10

(56) References Cited

U.S. PATENT DOCUMENTS

| | | | | |
|---|---|---|---|---|
| 5,189,606 A | * | 2/1993 | Burns et al. | 705/10 |
| 5,197,120 A | | 3/1993 | Saxton et al. | 395/139 |
| 5,255,207 A | | 10/1993 | Cornwell | 364/512 |
| 5,745,765 A | | 4/1998 | Paseman | 395/701 |
| 5,918,219 A | * | 6/1999 | Isherwood | 705/37 |
| 5,920,849 A | | 7/1999 | Broughton et al. | 705/400 |
| 5,975,908 A | | 11/1999 | Hulten | 434/72 |
| 5,983,010 A | | 11/1999 | Murdock et al. | 395/500.27 |

OTHER PUBLICATIONS

Li et al.; A feature based parametric modeling system for CAD/CAPP/CAM integrated system; IEEE Int Conf Indust. Tech.; pp. 329–333; Dec. 1996.*

Krishnan et al.; Parametric model: a conceptual framework for geometric modelling databases; Sec. Int Conf Data and Knowledge Sys for Manufacturing and Engineeriing; pp. 161–171; Oct. 1989.*

(List continued on next page.)

Primary Examiner—Hugh Jones
(74) Attorney, Agent, or Firm—Haynes and Boone, LLP

(57) ABSTRACT

A computer-implemented automated building design and modeling and construction project cost estimating and scheduling system ("DMES system") is described. The DMES system provides a central source for all of the design and construction information for a construction project in a coordinated two-dimensional and three-dimensional spatial database that is freely accessible by all of the members of an interdisciplinary construction project team as a means to produce automatically coordinated design development and construction document information. The DMES system acquires and stores all of the appropriate design, engineering, and construction expertise and information available for any building type for use in automatically assembling and coordinating the design, cost-estimating, and scheduling for a construction project. In one embodiment, the DMES system consists of a plurality of objects, comprising elements and massing elements arranged in an assembly hierarchy. Each of the objects includes programming code that defines an interface and discrete internal functions that define its behavior. When instantiated in the database, the objects automatically create further instances of other objects in the hierarchy, which in turn do the same, thus assembling a complete building model automatically from the initial manually-placed instance. The building model enables automatic generation of drawings and cost and scheduling information. By running automatic iterations of the building model, multiple designs may be evaluated to determine the optimum design.

28 Claims, 38 Drawing Sheets

OTHER PUBLICATIONS

"AEC Objects Buyer's Guide—Table 1: AEC 3D to 2D Program Features," www.Cadalyst.com.; Jun. 2000.
"Design ++" product brochure, Design Power Inc.; received by Applicant: Apr. 1997.
"AutoRouter 2.0" product brochure, Design Power, Inc.; received by Applicant: Apr. 1997.
"PlantBuilder" product brochure, Design Power, Inc.; received by Applicant: Apr. 1997.
"PlantDrafter" product brochure, Design Power, Inc.; received by Applicant: Apr. 1997.
"Design Power Success: Hollandsche Beton–en Waterbouw by" product testimonial, Design Power, Inc.; received by Applicant: Apr. 1997.
"Design Power Success: Nextrom Technologies" product testimonial, Design Power, Inc.; received by Applicant: Apr. 1997.
"Design Power Success: Fluor Daniel, Inc." product testimonial, Design Power, Inc.; received by Applicant: Apr. 1997.
International Search Report dated May 1, 2001.

* cited by examiner

| | |
|---|---|
| Interview Massing | Allows input of design requirements from customer and initiates automatic assembly of building model by placing instances of the next tier of massing elements in the hierarchy and passing them appropriate design parameters. This massing element also places an instance of the interview estimate element, which is automatically passed quantity data directly from each of the elements in the hierarchy. |
| Interview Estimate | Placed by the interview-massing element, this element is automatically passed quantity data by the other elements in the hierarchy when they are executed. It then generates a graphical spreadsheet in the database, which displays the cost estimate data. |
| Cladding Massing | Placed by the interview-massing element, this element is automatically passed the building parameters and the requirements for the cladding. It then assembles the appropriate cladding types on each part of each elevation of the building model by placing the curtainwall massing and precast massing elements as required. |
| Curtainwall Massing | Calculates the curtainwall cladding and glazing requirements for the building from the building parameters passed to it by the interview-massing element and design data read in from external data files. This element then assembles the curtainwall cladding and windows around the building by placing consecutive instances of the curtainwall element and the parapet, entrance and canopy elements. |
| Curtainwall Element | Designs the individual curtainwall or glazing panel from design parameters passed to it by the curtainwall-massing element. This element also calculates an accurate set of quantities for materials and components used to assemble the panel. The element can also place instances of the entrance and canopy elements when required, and pass them appropriate design parameters. |
| Parapet Element | Designs the individual roof parapet sections from design parameters passed to it by the curtainwall-massing element. This element also calculates an accurate set of quantities for materials and components used to assemble the parapet section. |
| Entrance Element | Designs the individual entrance doors and panels from design parameters passed to it by the curtainwall element. This element also calculates an accurate set of quantities for materials and components used to assemble the entrance. |
| Canopy Element | Designs the individual canopies over the main entrances from design parameters passed to it by the curtainwall element. This element also calculates an accurate set of quantities for materials and components used to assemble the canopy. |
| Curtainwall Estimate | Placed by the curtainwall-massing element, this element is automatically passed quantity data by the curtainwall elements when they are executed. It then generates a graphical spreadsheet in the database, which displays the cost estimate data for the curtainwall cladding and glazing. |

Fig. 2g

| | |
|---|---|
| Precast Massing | Calculates the precast cladding requirements for the building from the building parameters passed to it by the interview-massing element and design data read in from external data files. This element then assembles the precast panels around the building by placing consecutive instances of the precast element. |
| Precast Element | Designs the individual precast panel from design parameters passed to it by the precast-massing element. This element also calculates an accurate set of quantities for materials, components and labor used to assemble the panel. |
| Precast Estimate | Placed by the precast-massing element, this element is automatically passed quantity data by the precast elements when they are executed. It then generates a graphical spreadsheet in the database, which displays the cost estimate data for the precast cladding. |
| Core Zones Massing | Placed by the interview-massing element, this element is automatically passed the building parameters and the requirements for the various core layouts. It then assembles the appropriate core layouts into each zone on each floor of the building model by placing the core massing element as required. |
| Core Massing | Calculates the core requirements for the building from the building parameters passed to it by the interview-massing element and design data read in from external data files. This element then assembles the rooms in the core of the building by placing the elevator massing element and consecutive instances of the room element. |
| Room Massing | Calculates the room requirements for the building from the building parameters passed to it by the interview-massing element and design data read in from external data files. This element then assembles the rooms on each floor of the building by placing consecutive instances of the room element. |
| Room Element | Calculates the requirements for each room from the room parameters passed to it by the core-massing or room-massing elements and design data read in from external room data files. This element then assembles the contents of the room in by placing instances of the lighting, electrical devices and furniture elements. |
| Stair Element | This element calculates the floor to floor stair requirements from data sent to it by the room element and sizes itself to fit the building. |
| Grouping Massing | This element assembles a group of instances in the appropriate locations from data read in from external data files. This element is typically placed by the room element to control the grouping of the contents of the room. |
| Door Element | This element calculates the opening requirements from data sent to it by the room element and sizes itself to fit the door opening. |

Fig. 2h

| | |
|---|---|
| Room Estimate | Placed by the core-massing or room-massing elements, this element is automatically passed quantity data by the room elements when they are executed. It then generates a graphical spreadsheet in the database, which displays the cost estimate data for the rooms. |
| Elevator Massing | Calculates the elevatoring requirements for the building from the building parameters passed to it by the interview-massing element and design data read in from external data files. This element then assembles the elevators on each floor of the building by placing consecutive instances of the elevator typical element and the elevator roof element. |
| Elevator Typical Element | This element calculates the typical floor to floor elevator requirements from data sent to it by the elevator massing element and sizes itself accordingly. |
| Elevator Roof Element | This element calculates the roof level elevator requirements from data sent to it by the elevator massing element and sizes itself accordingly. |
| Elevator Estimate | Placed by the elevator-massing element, this element is automatically passed quantity data by the elevator elements when they are executed. It then generates a graphical spreadsheet in the database, which displays the cost estimate data for the elevators. |
| Light Massing | Calculates the lighting requirements for each floor of the building from the building parameters passed to it by the interview-massing element and design data read in from external data files. This element then assembles the lights on each floor of the building by placing consecutive instances of the light element. Potential clashes between lights and other building components are automatically handled by functionality in this element checking the positioning of these elements and repositioning each light. |
| Light Element | Configures its self as the appropriate light fixture dependent on data passed to it by the light massing element. This element also routes its own circuit wiring to connect it to its neighbor in the circuit or to the light switch or appropriate junction box. It then calculates the types and quantities of wire and insulation used. |
| Lighting Estimate | Placed by the light-massing element, this element is automatically passed quantity data by the light elements when they are executed. It then generates a graphical spreadsheet in the database, which displays the cost estimate data for the lights and wiring. |
| Building Shape Element | Determines the building configuration and floor plate area. Allows adjustment of various variables that make up the building perimeter. Calculates the perimeter points and sends this information to the grid/dimension element to calculate the grid layout then the structure element is called to calculate the structural components and estimate. |

Fig. 2i

| | |
|---|---|
| Grid/ Dimension Element | Calculates the grid layout dimensions for the building configuration. |
| Structure Element | Receives the building layout and grid locations from above elements then calculates all pier, column, beam and joist locations. Accumulates all quantities and develops an estimate for the structure. |
| Pier Cap/ Grade Beam Element | Calculates the location and sizes for the pier caps and grade beams. |
| Electrical Massing | Calculates the electrical service requirements for each floor of the building from the parameters passed to it by the interview-massing element and design data read in from external data files. This element then assembles electrical service equipment and wiring on each floor of the building by placing consecutive instances of the electrical device element. It can also generate a graphical spreadsheet in the database, which displays the high and low voltage electrical service panel circuit breaker diagrams. |
| Electrical Device Element | Configures its self as the appropriate electrical equipment or device dependent on data passed to it by the electrical massing element. This element also routes its own circuit wiring to connect it to its neighbor in the circuit or to the appropriate junction box. It then calculates the types and quantities of wire and insulation used. |
| Electrical Estimate | Placed by the electrical-massing element, this element is automatically passed quantity data by the electrical device elements when they are executed. It then generates a graphical spreadsheet in the database, which displays the cost estimate data for the electrical devices, equipment and wiring. |
| HVAC Massing | Receives the building configuration from the building shape element then calls the HVAC Area element to calculate all zone areas. Then passes these areas to the peaks element which calls the tables element and the floor and building peak loads are calculated. This element then places instances of the exterior, interior and corner VAV elements, which calculate the VAV box and Duct sizes. |
| HVAC Exterior VAV Element | Calculates the exterior VAV box, duct and diffuser sizes for the perimeter zones. |

*Fig. 2j*

| | |
|---|---|
| HVAC Interior VAV Element | Calculates the interior VAV box, duct and diffuser sizes. |
| HVAC Corner VAV Element | Calculates the corner VAV box, duct and diffuser sizes for the perimeter zones. |
| HVAC Area Element | Receives the building perimeters from the HVAC massing element, breaks the building up into interior, exterior and corner zones then calculates the floor square footage for each zone. |
| HVAC Peaks Element | Receives the ASHRAE cooling and heating load tables from the tables element and the zone areas from the area element and calculates the building and floor peak load design criteria. |
| HVAC Tables Element | Receives the longitude, latitude and other pertinent information about the building location and creates cooling load, solar gain and factor tables to be used to calculate the design building loads. |
| HVAC Estimate | Placed by the HVAC-massing element, this element is automatically passed quantity data by the HVAC elements when they are executed. It then generates a graphical spreadsheet in the database, which displays the cost estimate data for the HVAC system. |
| Site Massing | Calculates the site requirements for the building from the building parameters passed to it by the interview-massing element and design data read in from external data files. This element then assembles the site layout around the building by placing applicable instances of the site element. |
| Site Element | Designs the individual site elements from design parameters passed to it by the site-massing element. This element also calculates an accurate set of quantities for materials and components used to assemble the site layout. |
| Site Estimate | Placed by the site-massing element, this element is automatically passed quantity data by site elements when they are executed. It then generates a graphical spreadsheet in the database, which displays the cost estimate data for the site layout. |
| Quantities Element | Placed by the interview-massing element, this element calculates additional required building components not covered by the individual estimate elements listed above. Applicable building information is passed by the interview-massing element when it is executed. It then generates a graphical spreadsheet in the database, which displays the cost estimate data for the additional building components. It also passes its quantity data directly to the interview estimate element. |

Fig. 2k

COMPUTER-IMPLEMENTED AUTOMATED BUILDING DESIGN AND MODELING AND PROJECT COST ESTIMATION AND SCHEDULING SYSTEM

BACKGROUND OF THE INVENTION

This invention relates generally to computer-aided design of buildings and, more particularly, to a system for enabling the computer-aided development of a design for a building, along with design development drawings, specifications, and cost and scheduling data associated with the design.

Demands for more expedient, more accurate design, cost, and schedule responses to clients' requests for new building and renovation work prompted the development of the invention described herein. Traditionally, architects, engineers, and contractors (the "AEC Industry") are pressured to respond ever more quickly to clients' requests for building designs, cost estimates, and construction schedules in connection with construction projects. In addition to needing to respond promptly to their clients requests for information and data, AEC Industry companies need to insure that such information and data is accurate. To remain competitive in today's marketplace, AEC Industry companies also need to dramatically reduce the time it takes to develop the requested information and data, as well as the overall project delivery time, at no expense to the quality of the project or the accuracy of the budget estimate.

Traditional drafting and computer-aided drafting ("CAD") techniques only serve to disseminate all of the information involved in designing and detailing a construction project and are time-consuming processes that require a high-level of interdisciplinary communication and management between architects, engineers, and contractors. What is missing from traditional design and construction processes is a means to quickly store, manage, and communicate all of the detailed knowledge and professional experience required by the various disciplines involved in the project in order to bring the project to a successful and timely conclusion.

To bring a suitable level of control and efficiency to the AEC Industry processes, it is imperative to centralize all of the project information and expertise in a single, coordinated database that would allow all of the entities involved in a construction project to instantly access and draw from it to expedite management and coordination of the constantly changing information. Such a database system would also be essential in helping to accurately, quickly, and clearly display and communicate the current design state to the various entities, as well as to the client, in order to facilitate informed responses and decisions.

Therefore, what is needed is a computer-implemented automated building design and modeling capability integrated with a construction project cost estimation and scheduling capability within a single system.

SUMMARY OF THE INVENTION

One embodiment, accordingly, comprises a computer-implemented automated building design and modeling and construction project cost estimating and scheduling system ("DMES system"). In a preferred embodiment, the DMES system provides a central source for all of the design and construction information for a construction project in a coordinated two-dimensional and three-dimensional spatial database that is freely accessible by all of the members of an interdisciplinary construction project team as a means to produce automatically coordinated design development and construction document information.

In a preferred embodiment, the DMES system acquires and stores all of the appropriate design, engineering, and construction expertise and information available for any building type for use in automatically assembling and coordinating the design, cost-estimating, and scheduling for a construction project. Such expertise and information includes design criteria, engineering formulas and calculations, manufacturers specifications, subcontractors' and suppliers' information, city codes and regulations, materials specifications, and client requirements.

In one embodiment, the DMES system consists of a plurality of objects, comprising elements and massing elements arranged in an assembly hierarchy. Each of the objects includes programming code that defines an interface and discrete internal functions that define its behavior. The objects, or elements, are compiled into a set of libraries, which are then loaded into the spatial database. When instantiated in the database, the objects automatically display appropriate graphical representations from different view points to produce two- and three-dimensional views of the resultant building model. Additionally, when instantiated in the database, the interfaces of the objects enable them to pass data between one another, and their internal functionality allows them to execute core functionalities of the database and internal functions of other objects in the model.

As used herein; "element" refers to an object that, when placed in the spatial database, represents a construction component of the structure being modeled and "massing element" refers to an object that has the same properties as an element, but can additionally place instances of other elements and massing elements into the spatial database. Typical programming code included in massing elements to enable them to place instances of other elements and massing elements in the database is set forth in Appendix A hereto.

In accordance with one embodiment, objects that are defined as "massing elements" are capable of directly creating instances of other objects and positioning them accurately in the building model, and passing data to and from these instances. As previously indicated, each of the objects also includes programming code that defines a graphical user interface, in the form of a dialog box, to the object that is displayed for enabling a user to create an instance of the object in the database. These dialog boxes allow data to be entered directly into a current instance of the object for use in the design of the building model.

In operation, an Interview massing element is manually placed in the spatial database, at which point its dialog box is displayed and the client's high-level requirements for the project are entered using the dialog box, then the automatic assembly process is run to create the building model. Additionally, manually placing a lower tier element into the database causes its dialog box to be displayed, allowing the user to control its configuration directly by inputting the desired parameters. Manually interfacing with lower tier elements and massing elements through their respective dialog boxes allows design requirements for those elements to be stored in external data files for use by the automated building assembly process when it is run.

Once the parameters are entered, as described above, the assembly process is initiated and run by executing the DMES system. During the assembly process, the Interview massing element assimilates the data input thereto via its dialog box and creates an instance of a first massing element in the second tier of the hierarchy and passes it appropriate design data. As previously indicated, data may also be passed to the element via its own individual dialog box. The second tier massing element in turn creates instances of lower tier elements and massing elements and passes them appropriate design data and so on. Once the process of passing data to and receiving data from the branch of the hierarchy headed by the first one of the second tier massing elements is complete, the Interview massing element creates an instance of the next massing element in the second tier of the hierarchy and the above-described process is repeated for that branch and for each subsequent branch in sequential order.

This effectively means there are two ways of running the DMES system. The initial method with the customer (building owner) is to place an instance of the Interview massing element and input various high-level choices into its dialog, then run the DMES system on that high-level information only. This causes a building to be assembled based on those high-level design decisions, and all of the other choices in the lower elements and massing elements in the hierarchy use their default (best practice) values. The second method includes an initial (optional) pre-pass, which involves placing individual instances of some or all of the elements and massing elements in the hierarchy, and inputting more detailed design decisions into their respective dialogs, and having that lower level detailed information saved in external data files for use by the DMES system when it is run. Then an instance of the Interview massing element is placed, as above, and various high-level choices are input into its dialog and the DMES system is then run based on that high-level information plus all of the design information gathered from the external data files by the elements and massing elements as they are automatically assembled.

This process continues autonomously until a complete building model has been assembled in the spatial database from the appropriate library elements as constrained by the defined project parameters. As each element is placed by its massing element, its internal functions are executed and it calculates the quantities of components and materials used and the number of man-hours of labor involved in its fabrication and installation. These quantities are passed directly to an Interview Estimate element where they are accumulated and priced for output either as a graphical estimate sheet in the database, or as the content of a transfer data file for passing to the cost estimating and scheduling systems.

Additionally, activity data is automatically input into the elements by the massing elements as the building model is being assembled. The massing elements also automatically write the activity data to a set of external data files, which in turn are transferred into a scheduling system to automatically generate a schedule. If the schedule is subsequently amended, the scheduling system generates revised activity data sheets, which when read in by the DMES system automatically update the activity scheduling data in the building model.

As the building model is being assembled in the database, it is possible to watch its progress in dynamic two- and three-dimensional views on a computer monitor. It is also possible to view on the computer monitor drawings and color renderings generated in the database and the estimate sheets and schedules developed by the other systems.

The result of this complete process is that the design of the building, the communication between the design disciplines, the manual production of the drawings, and the management of the drawing coordination are all replaced by the automatic DMES process. This automatic DMES process encapsulates the knowledge and expertise of the designers and engineers, and the rules and codes of the construction industry specialists and regulatory bodies. It accepts the design requirements of the building owner, or customer, then automatically generates the appropriate building design in the form of a coordinated building model and generates the coordinated design documents necessary to construct the building. This automatic process is many thousands of times faster than the traditional methods. Such a dramatic decrease in production time brings with it huge reductions in cost by removing the need for teams of designers, engineers, estimators, drafters and managers, while delivering a more accurately coordinated set of design and production documents.

In one aspect, the DMES system is capable of using fixed, non-parametric graphical objects as components of the building model while gathering useful information from them. This is achieved through use of a parametric massing element referred to as a grouping massing element, that has the ability to assemble any single instance or grouped instances of elements. Each such massing element assembled in the model contains the names of the element or elements it in turn has assembled in the model. This massing element also contains functions that store specific information about the various elements it may be assembling, along with functionality and calculations associated with those elements. The grouping massing element therefore contains the parametric behavior required of the elements it assembles in the model, and those elements can therefore either be parametric or fixed, non-parametric graphical elements. The result is that non-parametric graphical elements may be transferred into the database of the DMES system from traditional CAD systems and those elements can be added to the element hierarchy used to assemble the building model. The high-level functionality can be added to these non-parametric elements when they are automatically assembled into the building model.

In another aspect, the DMES system is capable of detecting physical clashes between various components of the building model as the model is being automatically assembled and automatically redesign the model to relocate the affected component(s) to avoid the clash. In contrast to a conventional CAD tool, which uses software algorithms that scan and sort the locations and extents of all three-dimensional primitive geometries in a building model and compares all of the locations thereof for potential overlaps, the DMES system of the present invention performs clash detection, or interference checking, by cross-checking the location and extents of a current instance of an object against only those other existing instances in the model, i.e., the spatial database, and adjusting its position if necessary before assembling it into the model. This automatic clash detection is part of the assembly code included in each massing element and each element uses its own specific functions to determine the parameters of a clash and the rules by which to reposition the instance. This process has a small incremental impact on the speed of the assembly process, but completely removes the need for a series of long clash detection exercises after the model is complete.

In another aspect, once the building configuration is determined, the steel reinforcement bar, or "rebar", system, i.e., the reinforcing steel and size of each girder, beam, joist and pier, will be automatically designed by the DMES system. In particular, based on the live load requirements of the building design, the DMES system calculates the load area of each structural member and applies the live loads, dead loads, point loads and any other load within that area to that member. The deflections, shears, and moments induced by these loads and the effects of loads on adjacent bays up to two spans are computed according to accepted engineering practice. From these computations, the member size and reinforcing steel size, spacing, configuration and location are determined. Any changes made to the design parameters will result in a redesign of the building model all the way down to the size, spacing, configuration and location of the reinforcing steel. In a preferred embodiment, the foregoing information may be electronically transmitted to a reinforcing steel supplier, thus enabling the fabrication process to begin immediately without awaiting final approval of the shop drawings, which can take several months, as is typically the case. Should the geometry of the building change, the above-described procedure is repeated and the new design is generated.

In an alternative embodiment, the detailed design information may be entered into the DMES system via a manual graphical design interface, instead of through the element and massing element dialogs boxes, thus facilitating use of the DMES system by architects and engineers, who will typically be more comfortable with sketching their designs into the DMES system rather than defining their designs by typing data into a multitude of dialog boxes and their input fields. The manual graphical design interface consists of a set of graphical tools which allow the designer to draw shapes and drag and drop symbols to represent the desired design layouts and configurations for things like building shape, room layouts and stair, elevator and restroom positioning. The data gathered by the manual graphical design interface is stored in external data files for use by the elements and massing elements when the DMES system is run.

A technical advantage achieved with the invention is the speed and accuracy with which it delivers high quality information to members of the project team and to the client when required.

Another technical advantage achieved with the invention is the ability of the DMES system to use fixed, non-parametric graphical objects as components of the building model.

Another technical advantage achieved with the invention is the ability of the DMES system to perform clash detection, or interference checking, as the building model is being assembled and to automatically redesign the model to relocate the affected components and avoid a detected clash.

Another technical advantage achieved with the invention is that it generates an accurate, full-sized building model in a computer by automatically assembling proprietary parametric objects encompassing generally available industry information into a coordinated, spatial database.

Yet another technical advantage achieved with the invention is that it enables the generation of any and all accurate coordinated design and construction drawings, details, specifications, shop drawings, cost estimates, and schedules for the project directly from the automatically assembled building model.

Yet another technical advantage achieved with the invention is that different data sets for implementing multiple design configurations may be input to the system along with incremental steps by which they are to vary. Assembly of all of the resultant building models occurs automatically in sequence such that they can be compared and the optimum building model selected. This process is referred to as "rattling the box" and enables multiple designs to be compared and evaluated and the optimum design to be selected therefrom.

Yet another technical advantage achieved with the invention is the reduction in building delivery times resulting from the speedier production of the requisite documents, as well as the elimination of the many on-site redesign issues that typically occur during the construction of a building due to poorly coordinated information being generated at the design document stage.

Yet another technical advantage achieved with the invention is the increase in quality achieved in the design documents due in part to the guaranteed coordination of the information, as well as the time reduction and automation in the document production process, which enables many more drawings and details to be produced than would typically be feasible. This array of extra information helps deliver a far more complete document set, which in turn enables more efficient management of the construction process.

Still another technical advantage achieved with the invention is its ability to automatically generate a fully coordinated building design by encapsulating the knowledge and expertise of the designers and engineers, and the rules and codes of the construction industry specialists and regulatory bodies.

Still another technical advantage achieved with the invention is that the detailed design information may be entered into the DMES system via a manual graphical design interface, instead of through the element and massing element dialogs boxes, thus facilitating use of the DMES system by architects and engineers, who will typically be more comfortable with sketching their designs into the DMES system rather than typing definition data into a multitude of dialog boxes and their input fields.

A further technical advantage achieved with the invention that, once the building configuration is determined, the rebar system is automatically designed by the DMES system.

BRIEF DESCRIPTION OF THE DRAWINGS

FIGS. 2b–2e illustrate values passed between selected elements of the assembly hierarchy of FIG. 2a.

FIGS. 2g–2k are a table of the functions performed by elements including the elements of the assembly hierarchy of FIG. 2a.

FIG. 4*o* illustrates a perspective view showing the of the building structure per the parameters specified using the dialog boxes of FIGS. 4*f*–4*i*.

FIGS. 5*a*–5*l* illustrate various stages of the assembly of a building model as presented on a computer display using the DMES system of FIG. 1.

DETAILED DESCRIPTION OF A PREFERRED EMBODIMENT

Figure 1:
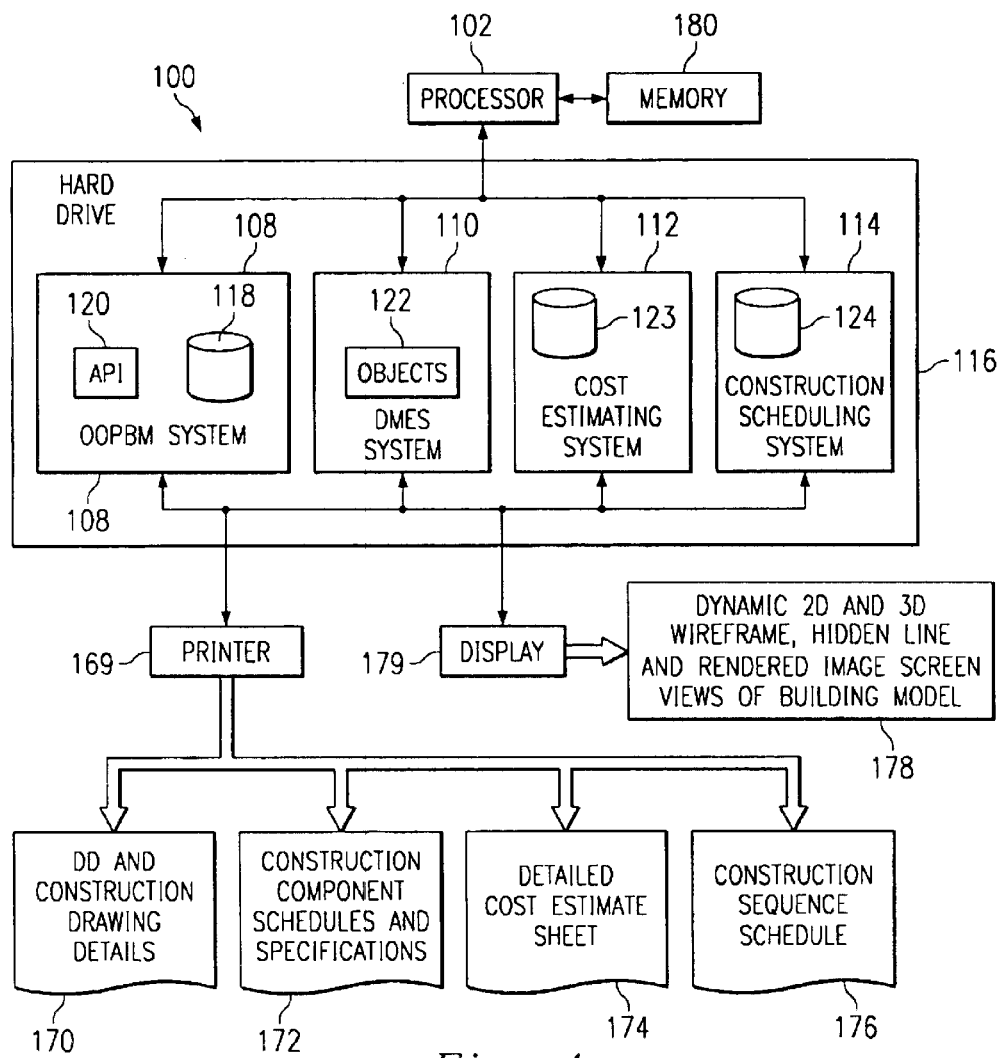
FIG. 1 is a block diagram of a computer environment for implementing a DMES system embodying features of the present invention.

FIG. 1 illustrates a system block diagram of a computer environment 100 for implementing the present invention. In a preferred embodiment, the environment 100 comprises a single computer, for example, a desktop PC, a laptop PC, or a Unix workstation. Alternatively, the invention may be implemented on a network of such computers, in which case the environment 100 comprises a server and a plurality of computers connected thereto in a conventional fashion via network connections. For purposes of illustration, it will be assumed herein that the environment 100 comprises a single computer. As shown in FIG. 1, software executable by a processor 102 for implementing a plurality of systems, including an object-oriented parametric building modeler ("OOPBM") system 108, a design, modeling, estimation, and scheduling ("DMES") system 110, a cost estimating system 112, and a scheduling system 114, is stored on a hard drive (not shown) of the computer 100. It will be recognized that, in the case of a network implementation of the present invention, the software for implementing the systems 108, 110, 112, and 114 will be stored on a server or equivalent thereof for access and execution by the various computers connected thereto. It will be further recognized that the software for implementing the systems 108, 110, 112, and 114 may be stored on a web server or the like to enable Internet access to and use of the invention described herein.

In a preferred embodiment, the OOPBM system 108 is implemented using Pro/REFLEX®, commercially available from Parametric Technology Corporation, of Waltham, Mass., the cost estimating system 112 is implemented using Ice 2000, commercially available from MC² Management Computer Controls, Inc., and the scheduling system 114 is implemented using SureTrak Project Management 2.0, commercially available from Primavera. Because the system 108, 112, and 114, are implemented using commercially available software, the operation thereof will not be described in detail other than as necessary to impart a complete understanding of the present invention. The composition and operation of the DMES system 112, which embodies the essence of the present invention, will be the focus of this document and will be described in greater detail below.

The OOPBM system 108 comprises a two-dimensional and three-dimensional parametric object-oriented modeler with its own proprietary spatial database 118. The system 108 enables graphical and non-graphical parametric objects to be defined using an Application Programmer's Interface ("API") 120 associated therewith. A graphical interface to the system 108 that enables libraries of these parametric objects to be placed into the database 118 and individual instances of the objects to be placed, or "instantiated" at accurate three-dimensional locations and orientations in the spatial database to assemble a dimensionally accurate building model. The system 108 then enables these groups of instantiated objects to be viewed in two- or three-dimensional views and coordinated drawings, color renderings, and movies to be generated from the database 118.

The DMES system 110 includes a plurality of objects 122 comprising elements and massing elements described in detail below with reference to FIG. 2*a* and developed using the API 120. Each of the objects 122 includes an internal interface through which it communicates with other objects in the hierarchy and a set of internal functions and variables that contain formulas and values that are calculated and assigned when the object is instantiated in the database 118. These formulas and values encapsulate the knowledge and expertise of the industry's designers, engineers, specialists, manufacturers, city building codes and regulations, and combine to create an expert system for the design and construction of a building. Exemplary code segments for encapsulating such information are set forth in Appendices B and C hereto. Specifically, the code segment set forth in Appendix B is incorporated into a Structural massing element (FIG. 2*a*) and calculates the necessary girder reinforcements, while the code segment set forth in Appendix C is incorporated into a HVAC Tables element (FIG. 2*a*) and reads a glass solar gain external file associated with that element and creates a table from the data contained therein.

When compiled, the API source code in the objects 122 is cross-compiled into dynamic link libraries ("DLLs") that link directly with executable code of the DMES system 110 to create classes in the database 118. They are organized in groups related to the various subsets of a construction project (applications), and ordered in an assembly hierarchy 200 (FIG. 2*a*) that forms a logical sequence for the assembly of a building model.

When instantiated in the database 118, the objects 122 automatically display appropriate graphical representations from different view points to produce two- and three-dimensional views of the resultant building model. Additionally, when instantiated in the database 118, the internal interfaces of the objects 122 enable them to pass data between one another, and their internal functionality allows them to execute core functionalities of the database and internal functions of other objects in the model.

As previously indicated, objects 122 that are defined as "massing elements" are capable of directly creating instances of other objects, positioning them accurately in the building model, and passing data to and from these instances. Each of the objects 122 also includes programming code that defines a graphical user interface, in the form of a dialog box, as illustrated in FIGS. 4*a*–4*d* and 4*f*–4*i*, to the object that is displayed when a user creates an instance of the object in the database 118. These dialog boxes allow data to be entered directly into a current instance of the object for use in the design of the building model when the automatic assembly process is run. Specifically, manually placing an instance of any massing element in the database 118 allows it to be manipulated through its dialog box to input new variable values and executed to automatically place instances of the objects below it in the assembly hierarchy 200 (FIG. 2a). As it places these instances, a massing element may pass newly calculated values for the predetermined variables to them and execute their internal functions to instruct them to carry out their automatic tasks.

The cost estimating system 112 comprises a singular database that contains up-do-date local and regional unit cost information to be associated with itemized cost code information being passed from individual instantiated objects, or elements. The link association is an automated import routine, which parses an output data file mapping specific item code numbers to their respective unit costs producing an estimate database 123. The estimate database 123 filters and sorts all fields sequentially to produce a compiled estimate. A report generator displays and formats the compiled estimate in CSI divisional sequence or user-defined layouts.

In one embodiment, the estimate database 123 is designed such that the cost data contained therein may be periodically updated either automatically or manually via local or remote access thereto. For example, in a web-based implementation of the present invention, it would be possible for one or more authorized individuals to upload updated cost data to the database 123 on the web server. Alternatively, it would be possible for one or more authorized individuals to download such updated cost data to the database 123 stored on a computer connected to a network server or to manually update the data by directly accessing the database and changing selected data.

The scheduling system 114 comprises a graphical scheduling database 124 that generates graphs and charts containing bars, which represent each of the construction activities for the building project. These activities incorporate dates, labor requirements, and sequencing for construction, assembly, and installation of the components and equipment of the building. Having assigned all of the activities relevant to a specific project and defined start dates, duration, and relationships of these activities, the system 114 automatically determines the critical path activities to minimize the overall project duration. The OOPBM system 108 described above enables all of the elements assembled into a building model in its database 118 to be assigned activity names and start and end dates for their construction or installation. As will be described below, the activity data is automatically input into the elements by the massing elements as the building model is being assembled. The massing we elements also automatically write the activity data to a set of external data files, which in turn are transferred into the scheduling system 114 to automatically generate a schedule. In particular, as shown in FIG. 2a, scheduling data is accumulated and passed to an Interview massing element 201, which writes a schedule transfer data file 210b to pass the data to the scheduling system 114 for in production of a suitably-formatted schedule. If the schedule is subsequently amended, the scheduling system 114 generates revised activity data files that, when read in by the DMES system 110, automatically update the activity scheduling data in the building model.

In one embodiment, it would be beneficial for the database 124 to contain data for generating maintenance, as well as construction, schedules to be used in maintaining the building after it is constructed according to the building model.

The OOPBM system 108 also has the ability to dynamically assemble and disassemble the building model by the scheduled construction sequence using the activity start and end dates stored in the instances of its component elements. This dynamic process therefore allows display of the construction state of the actual building project on any specific date.

Figure 1A:
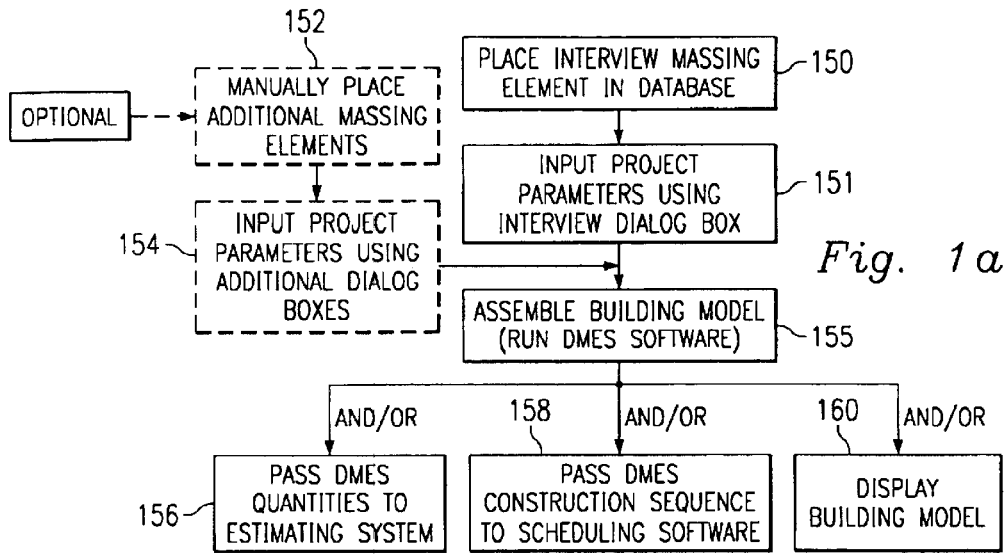
FIG. 1a is a flowchart of the operation of one embodiment of the present invention.
Figure 1B:
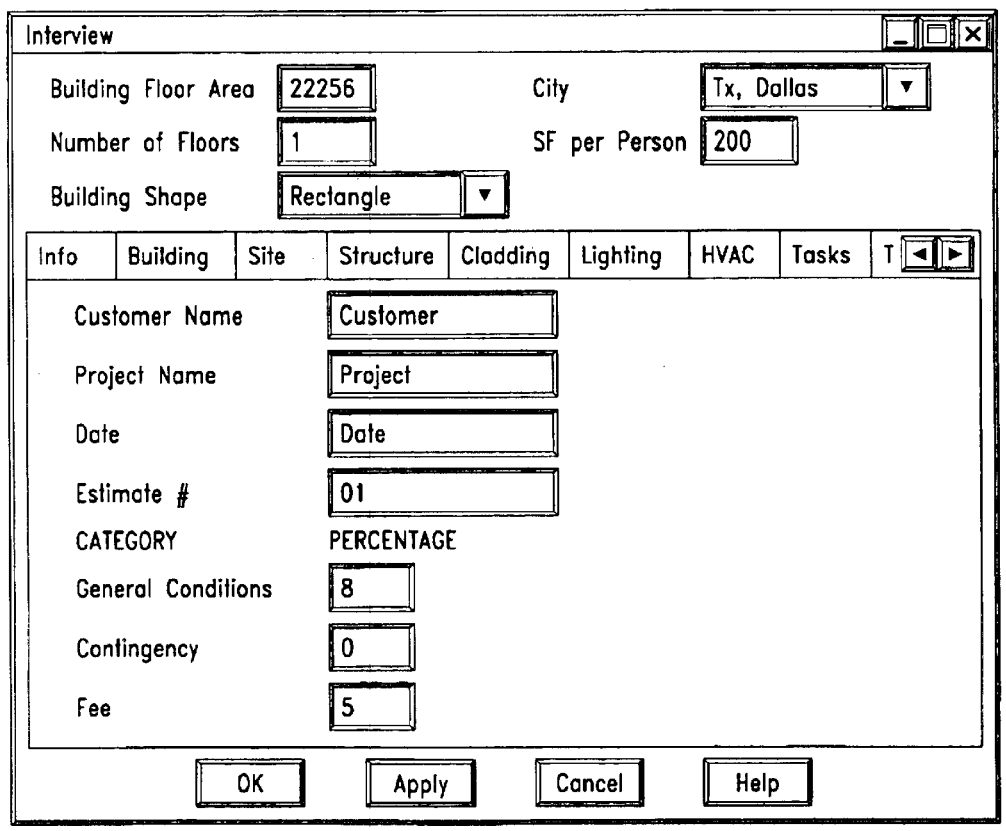
FIG. 1b illustrates an Interview dialog of the DMES system of FIG. 1 for enabling a user to specify various parameters for a building to be designed and modeled.

The operation of the present invention will now be generally described with reference to FIGS. 1a, 1b, and 2a. As shown in FIG. 1a, execution begins in step 150 in which the only element in a first tier of the assembly hierarchy 200 (FIG. 2a), which is an Interview massing element 201, is manually placed in the database 118. In step 151, the client's high-level requirements for the project are entered via a dialog box associated with the Interview massing element, as illustrated in FIG. 1b. Specifically, manually placing the Interview massing element causes its dialog box (FIG. 1b) to be displayed, thus enabling the user to select which of the other elements the user wants the Interview massing element to place automatically. The tabs on the Interview dialog box enable the user to input some of the high-level data relevant to each of the selected elements, which data is passed to those elements as they are placed during the assembly process.

Additionally, manually placing a lower tier element into the database 118 causes its dialog box to be displayed (see, e.g., FIGS. 4a–4d and 4f–4i) (step 152), allowing the user to control its configuration directly by inputting the desired parameters (step 153) and have these parameters stored in data files for use by the automatic assembly process when it is run. If the element is a massing element, the user can also input the desired parameters for elements below the current element in the assembly hierarchy 200 (FIG. 2a) and the massing element will appropriately place those elements automatically. These optional steps will be taken, if at all, before step 150, described above.

As illustrated in steps 150–153, there are effectively two ways of running the DMES system. The initial method with the customer (building owner) is to place an instance of the Interview massing element and input various high-level choices into its dialog, then run the DMES system on that high-level information only. This causes a building to be assembled based on those high-level design decisions, and all of the other choices in the lower elements and massing elements in the hierarchy use their default (best practice) values. The second method includes an initial (optional) pre-pass, which involves placing individual instances of some or all of the elements and massing elements in the hierarchy, and inputting more detailed design decisions into their respective dialogs, and having that lower level detailed information saved in external data files for use by the DMES system when it is run. Then an instance of the Interview massing element is placed, as above, and various high-level choices are input into its dialog and the DMES system is then run based on that high-level information plus all of the design information gathered from the external data files by the elements and massing elements as they are automatically assembled.

Figure 2A:
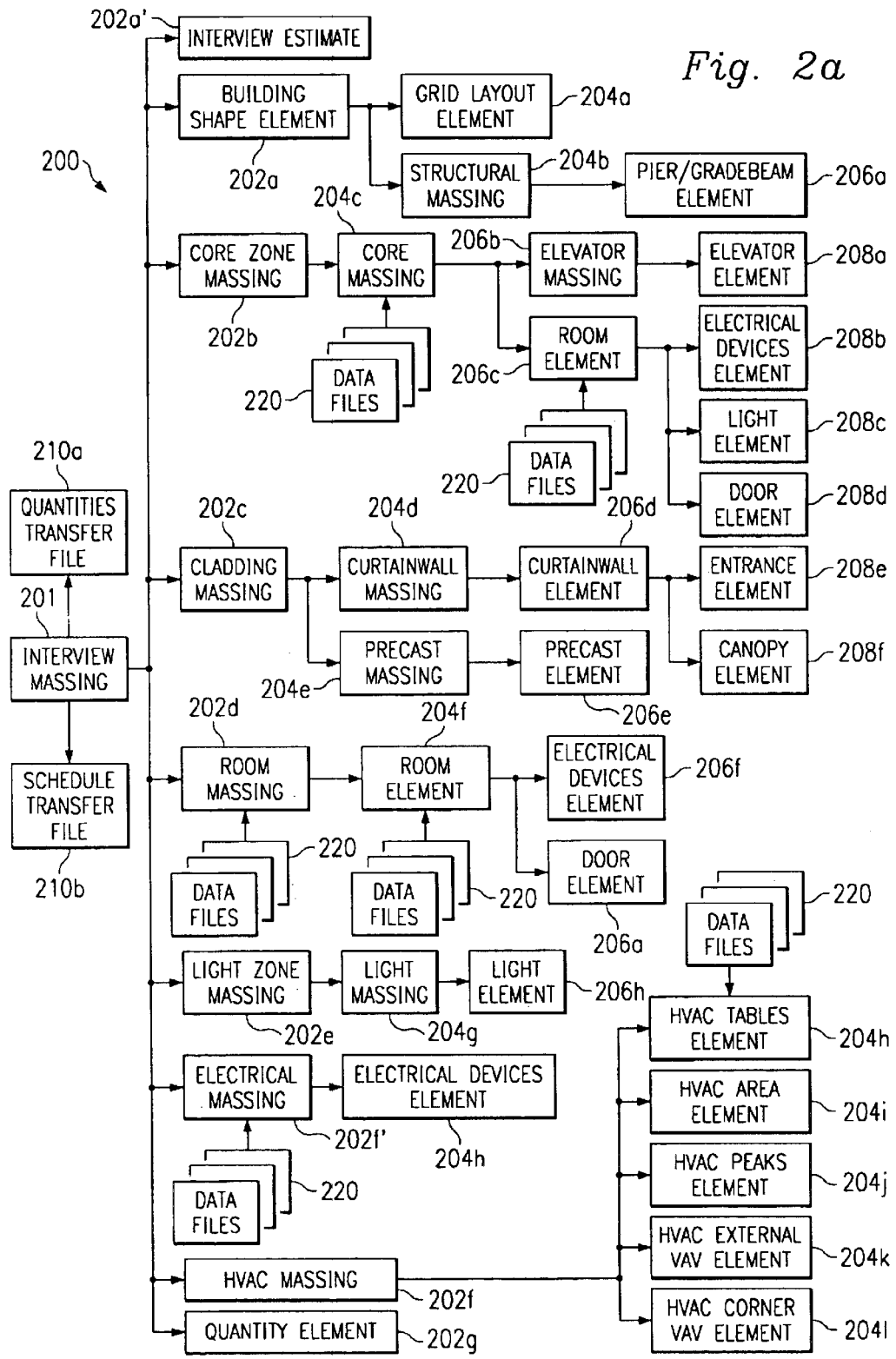
FIG. 2a illustrates an assembly hierarchy in accordance with the present invention.

Referring briefly to FIG. 2a, the assembly hierarchy 200 comprises a plurality of elements for implementing the DMES system 110. As will be described in greater detail below, elements in each tier of the hierarchy 200 pass values to and receive values from elements in the immediately preceding and the immediately succeeding tier. In particular, the first tier includes an Interview massing element 201, which passes values to and receives values from an Interview Estimate element 202a', a Building Shape massing element 202a, a Core Zone massing element 202b, a Cladding massing element 202c, a Room massing element 202d, a Light Zone massing element 202e, an HVAC massing element 202f, an Electrical massing element 202f', and a Quantity element 202g, all of which are located in the second tier. Similarly, the elements 202a–202f' in the second tier pass values to and receive values from a Grid Layout element 204a, a Structural massing element 204b, a Core massing element 204c, a Curtainwall massing element 204d, a Precast massing element 204e, a Room element 204f, a Light massing element 204g, an HVAC Tables element 204h, an HVAC Area element 204i, an HVAC Peak element 204j, an HVAC External VAV element 204k, an HVAC Corner VAV element 2041, and an Electrical Devices element 204m, all of which are in the third tier. The elements 204b–204g in the third tier pass values to and receive values from a Pier, Gradebeam element 204a, an Elevator massing element 206b, a Room element 206c, a Curtainwall element 206d, a Precast element 206e, a second Electrical Devices element 206f, a Door element 206g, and a Light element 206h, all of which are in a fourth tier. Finally, the several elements of the fourth tier, i.e., elements 206b, 206c, 206e, and 206f, pass values to and receive values from an Elevator element 208a, a third Electrical Devices element 208b, a Light element 208c, a Door element 208d, an Entrance element 208e, and a Canopy element 208f, all of which are in a fifth tier.

Referring again to FIG. 1a, in step 154, an assembly process is initiated and run by executing the DMES system 110. During the assembly process, the Interview massing element 201 assimilates the data input thereto via its dialog box (FIG. 1b) and creates an instance of a first element in the second tier of the hierarchy, and passes it appropriate design data. As previously indicated, data may also be passed to the element 202a' via its own individual dialog box. The second tier massing element in turn creates instances of lower tier elements and massing elements, if any, and passes them appropriate design data and so on. Once the process of passing data to and receiving data from the branch of the hierarchy headed by the first one of the second tier massing elements is complete, the Interview massing element creates an instance of the next massing element in the second tier of the hierarchy and the above-described process is repeated for that branch and for each subsequent branch in sequential order.

In summary, as each element is placed in the database 118 by one of the massing elements, data is passed to it by the massing element. The massing element then executes its internal function(s), including placing instances of other elements, where appropriate, and gets back values of specific variables in that element for use in other elements in the hierarchy. Through this process of passing and receiving new data via the elements' internal interfaces, design information is passed from one element to the next in the building model as it is being assembled by the massing elements. This process causes each element to design itself based on the new data it receives when it is placed in the database and to pass on the results of its calculations to the element(s) in the next tier of the hierarchy.

For example, with reference to the assembly hierarchy 200 of FIG. 2a, the Interview massing element 201 first creates an instance of the Interview Estimate element 202a' and passes the appropriate data thereto. After the Interview massing element 201 receives the requisite data back from the Interview Estimate element 202a', it creates an instance of the Building Shape massing element 202a and passes data thereto. The Building Shape massing element 202a then creates an instance of the Grid Layout element 204a and passes the appropriate data thereto, awaits the return of data therefrom, and then creates an instance of the Structural massing element 204b and passes the appropriate data thereto. The Structural massing element 204b creates an instance of the Pier/Gradebeam element 206a, passes the appropriate data thereto and awaits the return of data therefrom, at which point it returns data to the Building Shape element 202a. The Building Shape element 202a returns the requisite data to the Interview Massing element 201, and the Interview Massing element creates an instance of the Core Zone massing element 202b.

This process continues autonomously as thus described for each branch of the hierarchy 200 down through the Quantity element 202g until a complete building model has been assembled from the appropriate library elements as constrained by the defined project parameters. As each element is placed by its massing element, its internal functions are executed and they calculate the quantities of components and materials used and the number of man-hours of labor involved in its fabrication and installation. These quantities are passed directly to the Interview Estimate element 202a' where they are accumulated and priced for output either as a graphical estimate sheet in the database 118, or as the content of a transfer data file for passing to the cost estimating system 112 (step 156).

As previously indicated, the activity data is automatically input into the elements by the massing elements above them in the assembly hierarchy as the building model is being assembled. The massing elements also automatically write the activity data to a set of external data files, which in turn are transferred into the scheduling system 114 to automatically generate a schedule. If the schedule is subsequently amended, the scheduling system 114 generates revised activity data sheets, which when read in by the DMES system 110 automatically update the activity scheduling data in the building model (step 158).

As the building model is being assembled in the database 118, it is possible to watch its progress in dynamic two- and three-dimensional views on a computer monitor. It is also possible to view on the computer monitor drawings in a variety of formats and color renderings generated in the database and the estimate sheets and schedules developed by the other systems (step 160). Additionally, as the building model is being assembled in the database 118, it is possible to watch its progress in dynamic two- and three-dimensional views 178 on a computer display 179.

Referring again to FIG. 1, all of the above software allows suitably detailed and coordinated documents to be sent to a printer 169 to produce dimensionally accurate scaled drawings and details 170, schedules and specifications 172, detailed cost estimates 174 and construction sequence schedules 176.

In a preferred embodiment, each element and massing element has built into it functionality that writes parameters input thereto via the dialog boxes to external data file(s), represented in FIG. 2a by data files 220, when this option is selected via the dialog box. The purpose of these data files is to store design parameters for a specific building design required for use by the automatic assembly process when it is run.

Additionally, each element and massing element has built into it functionality that reads the appropriate data file(s) 22 during the automatic assembly process (FIG. 1a, step 154). This enables detailed design decisions to be made up front, using the natural graphical interface of each element and its corresponding dialog box, which get stored in the external data files for use when the building is being assembled.

It should be noted that the hierarchy 200 shown in FIG. 2a is for purposes of illustration only and, for that reason, does not include all of the elements, massing elements, and data files that might be used in implementing the present invention.

From the moment the Interview massing element is placed in the database 118, given new client information, and executed, this process of automatic self-assembly proceeds to design and create the finished building model very quickly. Other internal functions that are executed by each element calculate quantities and costs of the components, materials, and labor involved in manufacturing, delivering, and installing that element into the structure. During the automatic assembly process, quantity and cost data are accumulated and passed directly to an Interview Estimate element 202h that is automatically placed in the database 118 by the Interview massing element 201. The Interview Estimate element 202h either displays the resultant cost estimate sheet in the database 118 or writes a quantities transfer data file 210a to pass the data to estimating system 112 for production of a suitably-formatted estimate sheet.

The completed building model created in the database 118 contains all of the detailed two- and three-dimensional information necessary to generate a complete set of coordinated construction documents, including full-color photorealistic renderings and movies. As will be described in greater detail below in connection with the "rattle the box" feature, the Interview massing element 201 also contains the functionality to allow variable building constraints to be input through its dialog, so that it then automatically assembles many buildings with varying parameters for design and/or cost comparison, for purposes to be described in greater detail below.

Figure 2B:
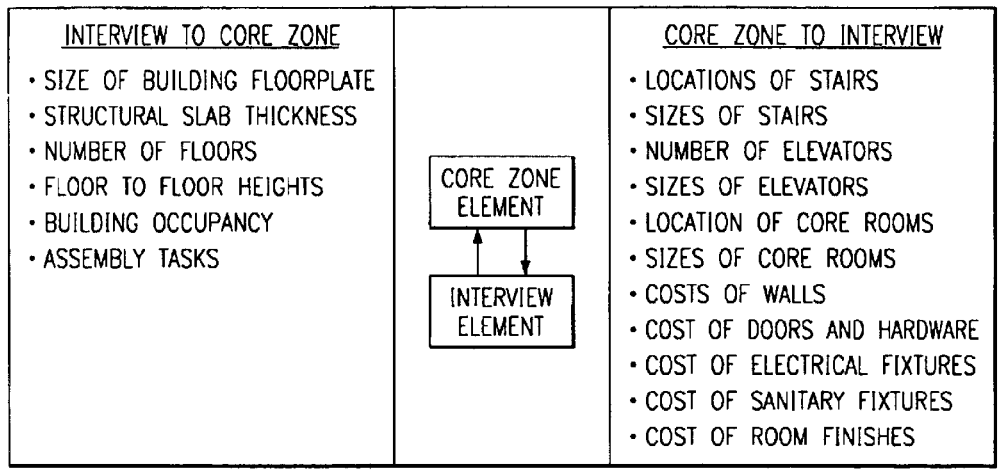

FIGS. 2b–2e illustrate values passed between the component elements of a selected branch, in this case, the third, or "Core Zone" branch, of the assembly hierarchy 200. It should be recognized that this branch is executed immediately after execution of the "Building Shape" branch, headed by the Building Shape massing element 202a, and immediately prior to execution of the "Cladding" branch, headed by the Cladding massing element 202b. FIG. 2b illustrates the values passed between the Interview massing element 201 and the Core Zone massing element 202b. The Interview massing element 201 gathers some basic information regarding the project and allows the user to change some high-level parameters of the building design and then controls the assembly hierarchy to produce a full-scale, three-dimensional model of the building, complete with drawings, specifications cost estimation, and schedule.

Figure 2C:
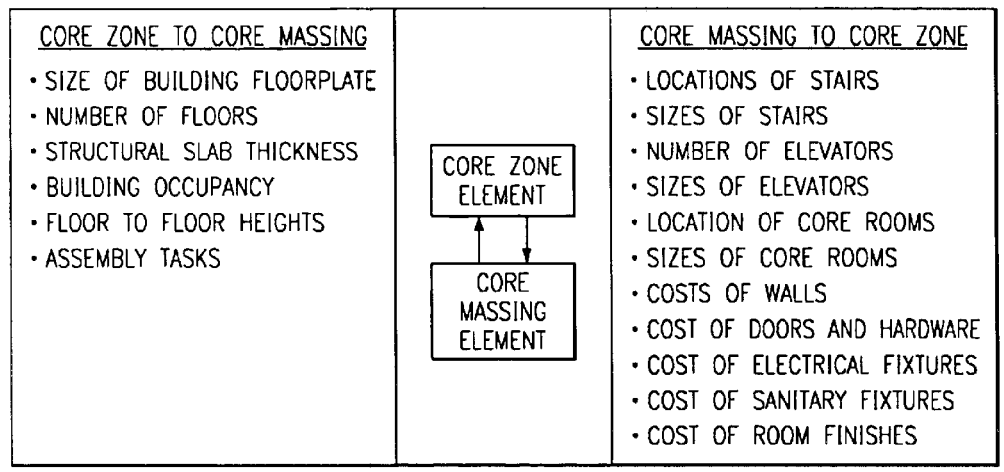

FIG. 2c illustrates the values passed between the Core Zone element 202b and the Core massing element 204c. The Core Zone element 202b determines the building zones by defining the zones of the building into the following classes: Bulk, Link, Leg, and Corner. These various zones are then passed to the Core massing element 204c, which will then place the appropriate rooms for each zone in the zone based on code rules and best practice. The Core massing element 204c is automatically placed by the Core Zone element 202b, which passes it all the necessary building design parameters and then triggers it to start sizing and placing the elevators and rooms in the core area.

Figure 2D:
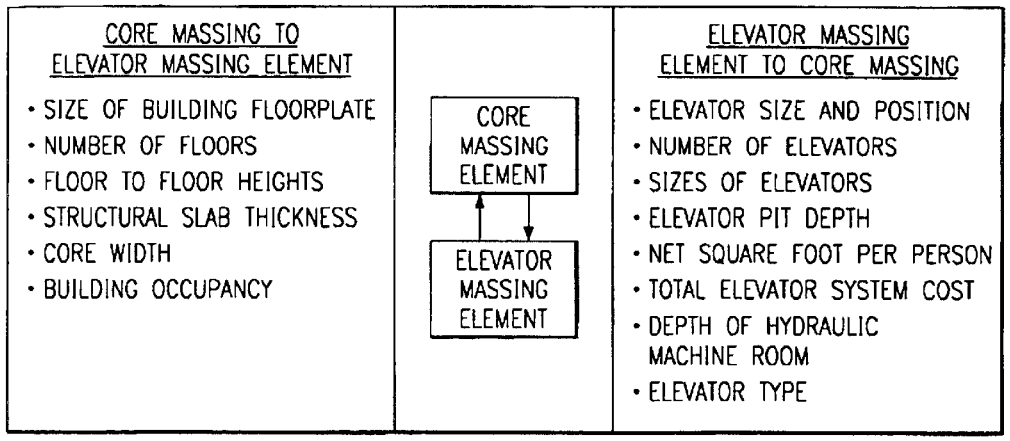
Figure 2E:
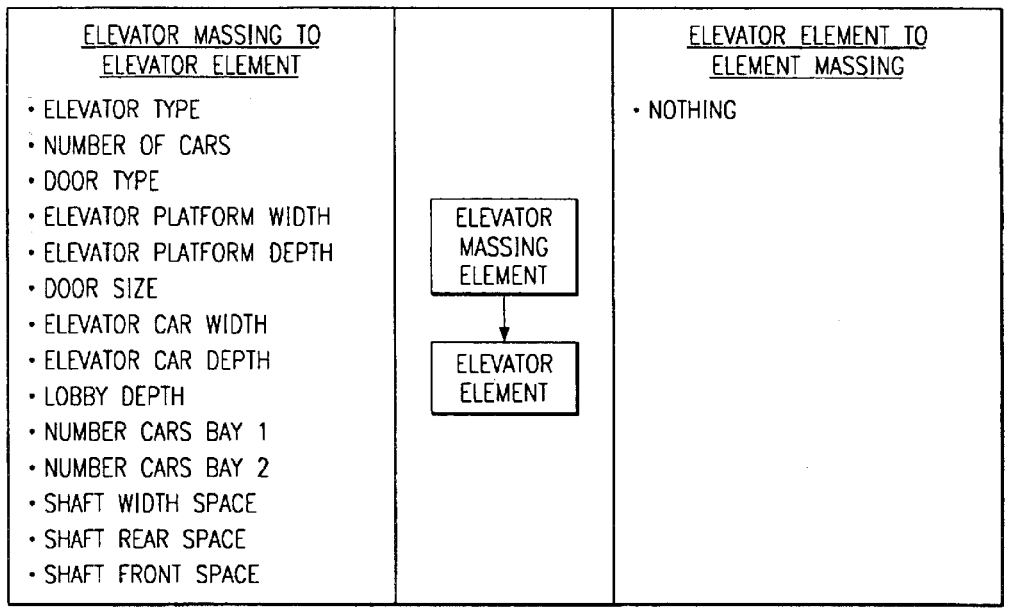

FIGS. 2d and 2e respectively illustrate the values passed between the Core massing element 204c and the Elevator massing element 206b and between the Elevator massing element and the Elevator element 208a. The Elevator massing element 204c places the number of elevators required for each core zone based on industry standard, traffic analysis calculations. It also designs and draws the shaft, pit, and motor room per industry practices and rules for core layout and elevator efficiencies.

Figure 2F:
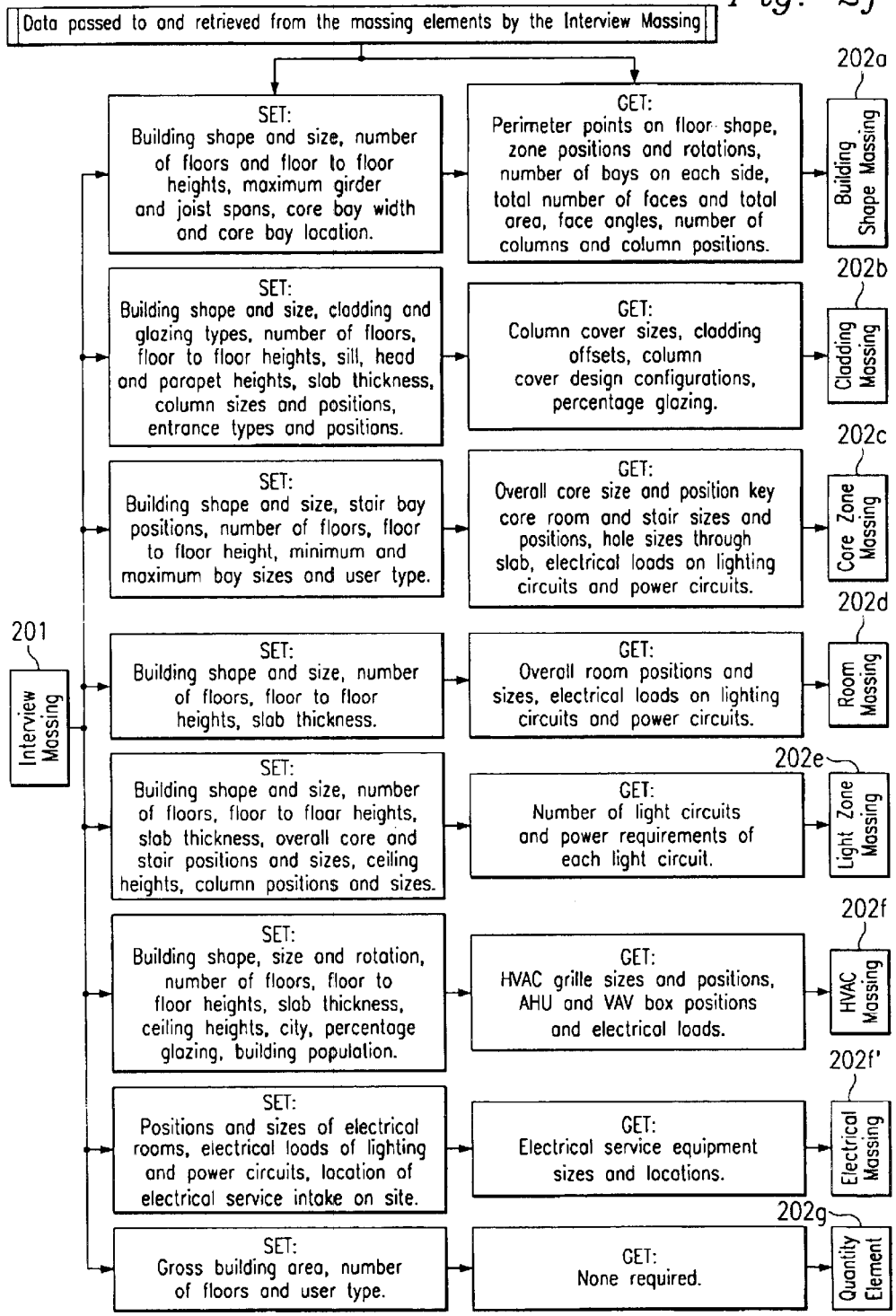
FIG. 2f is a chart illustrating the data passed between an element in a first tier of the assembly hierarchy of FIG. 2a and elements in a second tier thereof.

FIG. 2f illustrates the type of information provided to and received from each of the second tier elements 202a–202g by the Interview massing element 201, it being understood that some of the information passed between the Interview massing element and second tier elements may flow down to or up from lower tier elements.

FIGS. 2g–2k collectively comprise a table including a more exhaustive list of the elements and massing elements of the DMES system 110, grouped according to type, as well as a description of the function of each.

Figure 3:
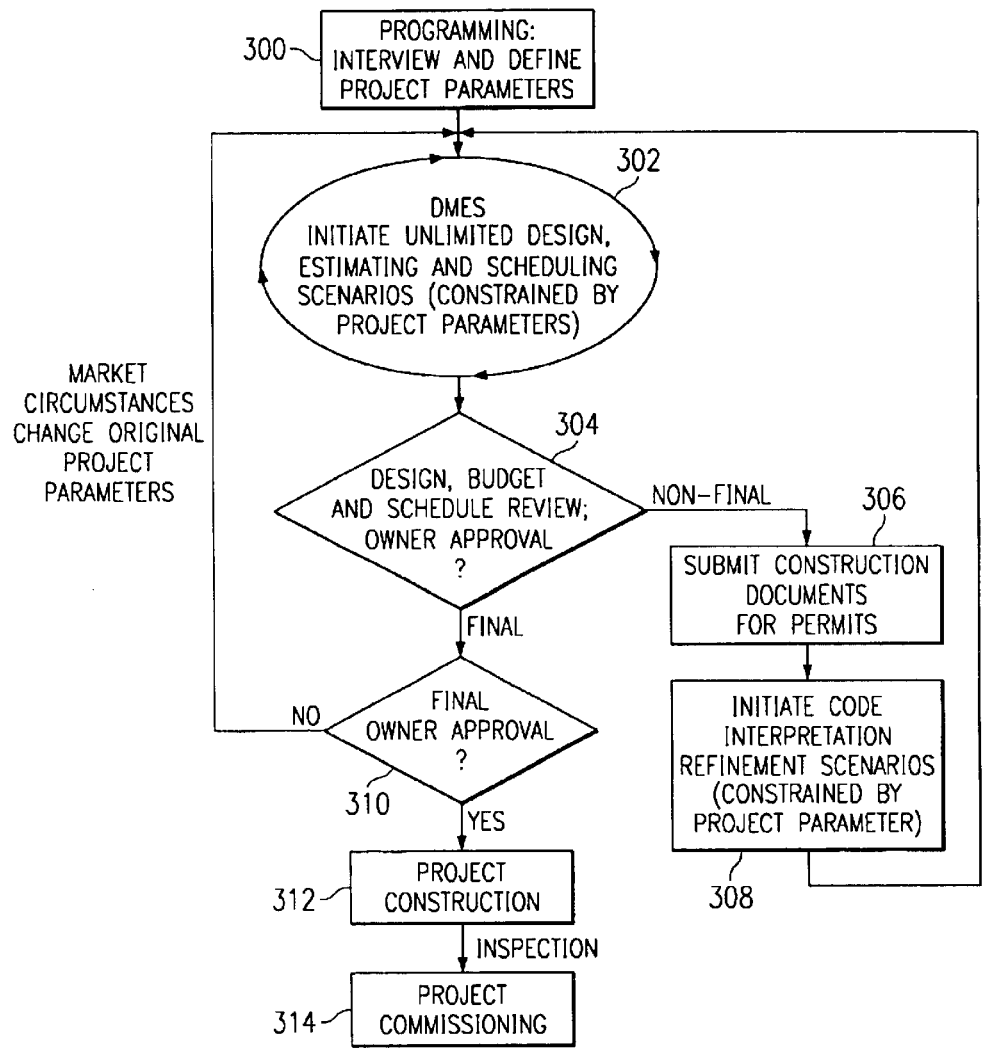
FIG. 3 is a flowchart of the design process implemented using the DMES system of FIG. 1.

FIG. 3 illustrates a process flow diagram for developing one or more building models using the DMES system 110. Execution begins in step 300 responsive to a request from a client to develop a project scenario. In step 300, parameters for the project are defined and input to the DMES system 110 as described below. Examples of project parameters include, but are not limited to, number of floors, total gross area, floor plate area, type of structure, and cladding systems. Upon completion of step 300, execution proceeds to step 302, in which a DMES process, implemented via the DMES system 110, is initiated. As described herein, and as generally shown and described with reference to FIG. 1a, the DMES process of step 302 is a continual feedback loop that produces a variety of building models and associated project scenarios, including cost estimates and construction schedules, intended to distill the vision of the client into a comprehensive solution, including a building model, cost estimate, and construction schedule, which is submitted to the client for design, budget, and schedule review and approval (step 304) and then forwarded to the appropriate authorities for code review and permitting purposes (step 306). In particular, the DMES process (step 302) results in the development of construction documentation, including construction drawings, details, specifications, renderings, movie paths, and shop drawings, itemized budgets, and detailed construction schedules, which are simultaneously produced for each building model.

In step 308, city building code interpretation refinement scenarios, constrained by the defined project parameters, are initiated and submitted to the DMES process (step 302). Once a building model and associated project scenario have been developed that fulfill the client's vision and with respect to which all necessary permits have been obtained, the building model and project scenario are submitted to the client for final approval (step 310). If approved, execution proceeds to step 312, construction of the project is undertaken and, upon inspection, the project is commissioned in step 314. If changing market or other conditions result in the client's not granting final approval in step 310, execution returns to step 302.

Figure 4A:
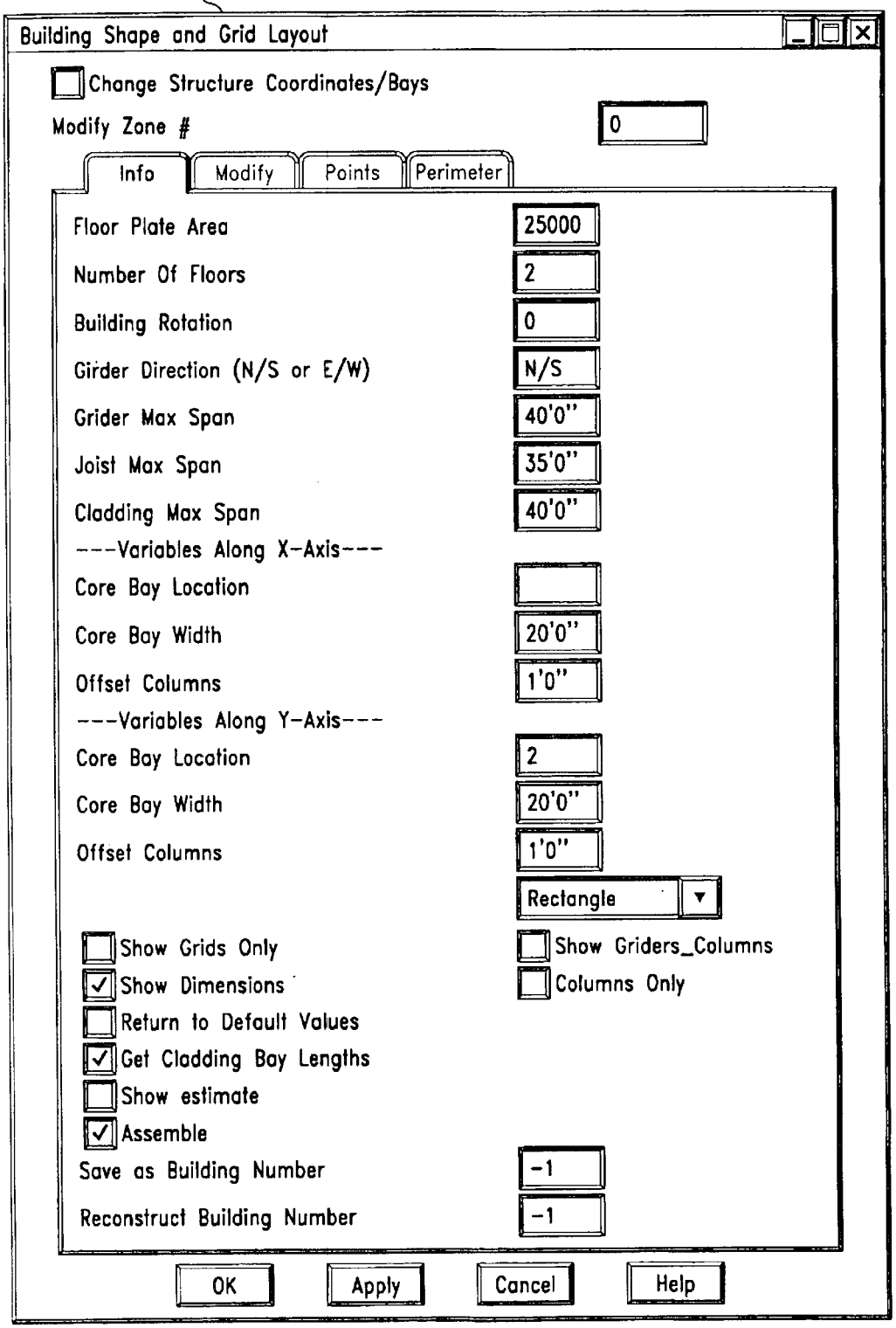
FIGS. 4a–4d illustrate Building Shape and Grid Layout dialog boxes of the DMES system of FIG. 1 for enabling a user to specify the building shape and grid layout of a building to be designed and modeled.

Referring now to FIGS. 4a–4d, a Building Shape and Grid Layout dialog box illustrated in FIGS. 4a–4d enables the user to specify specific information about the building shape and grid layout for the building. It will be recognized that the Building Shape and Grid Layout dialog box is associated with the Building shape element 202a (FIG. 2a) and is used to input data thereto. As shown in FIG. 4a, using an Info tab dialog box 402, the user can specify the floor plate area, number of floors, and rotation for the structure by making entries in the appropriate fields. Additionally, the user can specify more specific items as they pertain to the structure, such as girder direction, girder maximum spans, exterior cladding spans, column set back from face of building, and the bay locations/widths for the building cores. When the above information is applied, the element will display the building configuration as shown in FIG. 4e.

By checking the appropriate check boxes, the user can select display options, such as showing the grid layouts, column locations, girder locations, building and grid dimensions. The user can also have the element calculate the column-to-column bay lengths around the perimeter of the building for the exterior skin by checking the appropriate checkbox. After the above layout is complete, the user can assemble the structure, placing all of the slabs, joists, beams, girders, columns, and piers, and then choose to display a complete estimate of the cost of the structure. The structure can then be saved as a building option, another building assembled, and the two options compared.

Figure 4B:
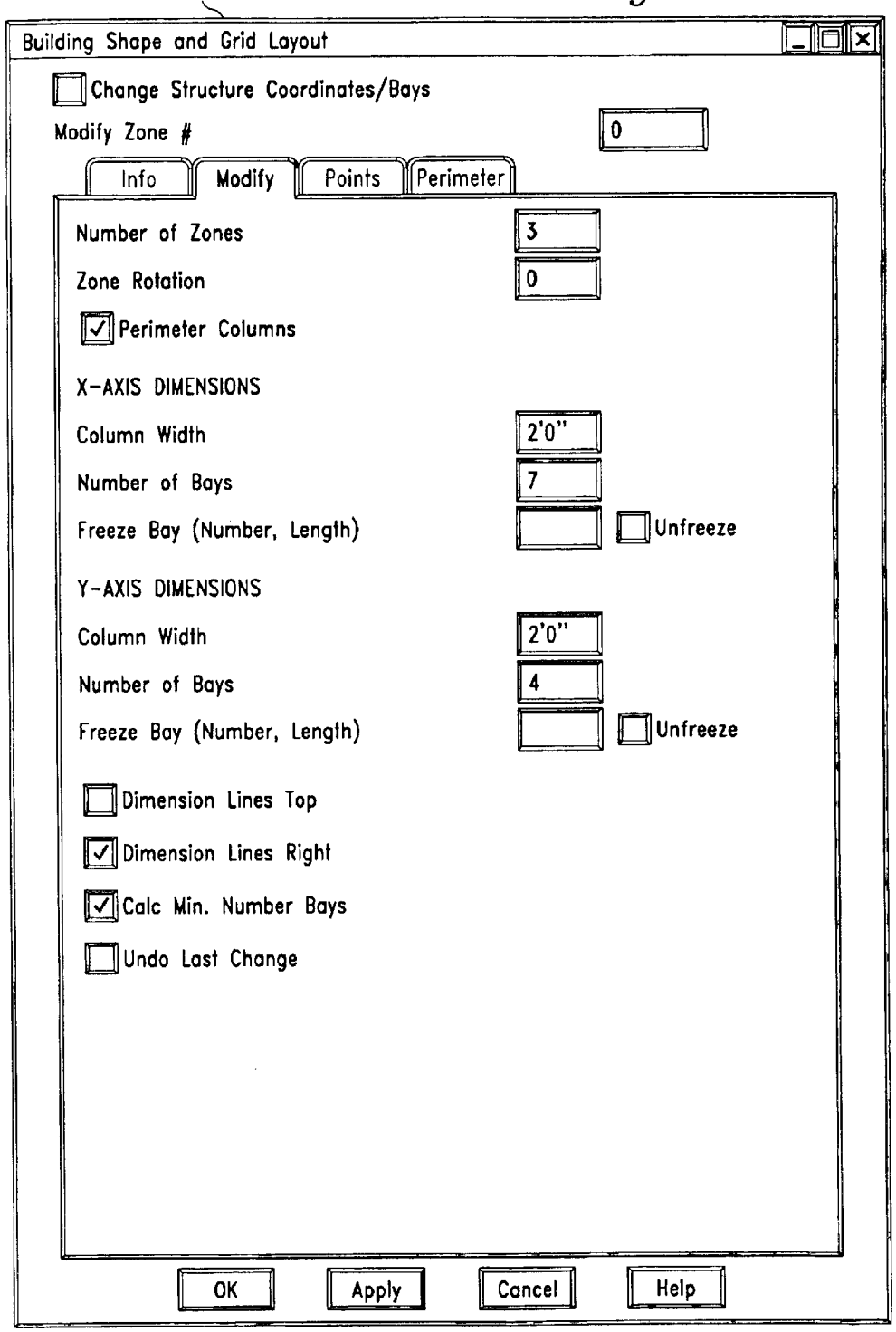

FIG. 4b illustrates a Modify tab dialog box 404. When the user selects the building shape using the Info tab dialog box 402 (FIG. 4a), the information on the Modify tab dialog box 404 is preassigned. By checking a checkbox designated "Change Structure Coordinates/Bays" located at the top of the dialog box 404, the information on the Modify tab dialog box 404 can be changed. In changing or creating a building shape, the user determines how many zones the building is made up of and the rotation of each zone. Once this is determined, the user can assign the column widths, number of bays, and freeze the actual bay lengths in each direction. If the structure is of tilt-up construction, the user can choose not to have the perimeter columns. The location of the dimension lines can be changed and the "number of bays" overridden by calculating the minimum number of bays possible by checking the appropriate check boxes near the bottom of the dialog box 404.

Figure 4C:
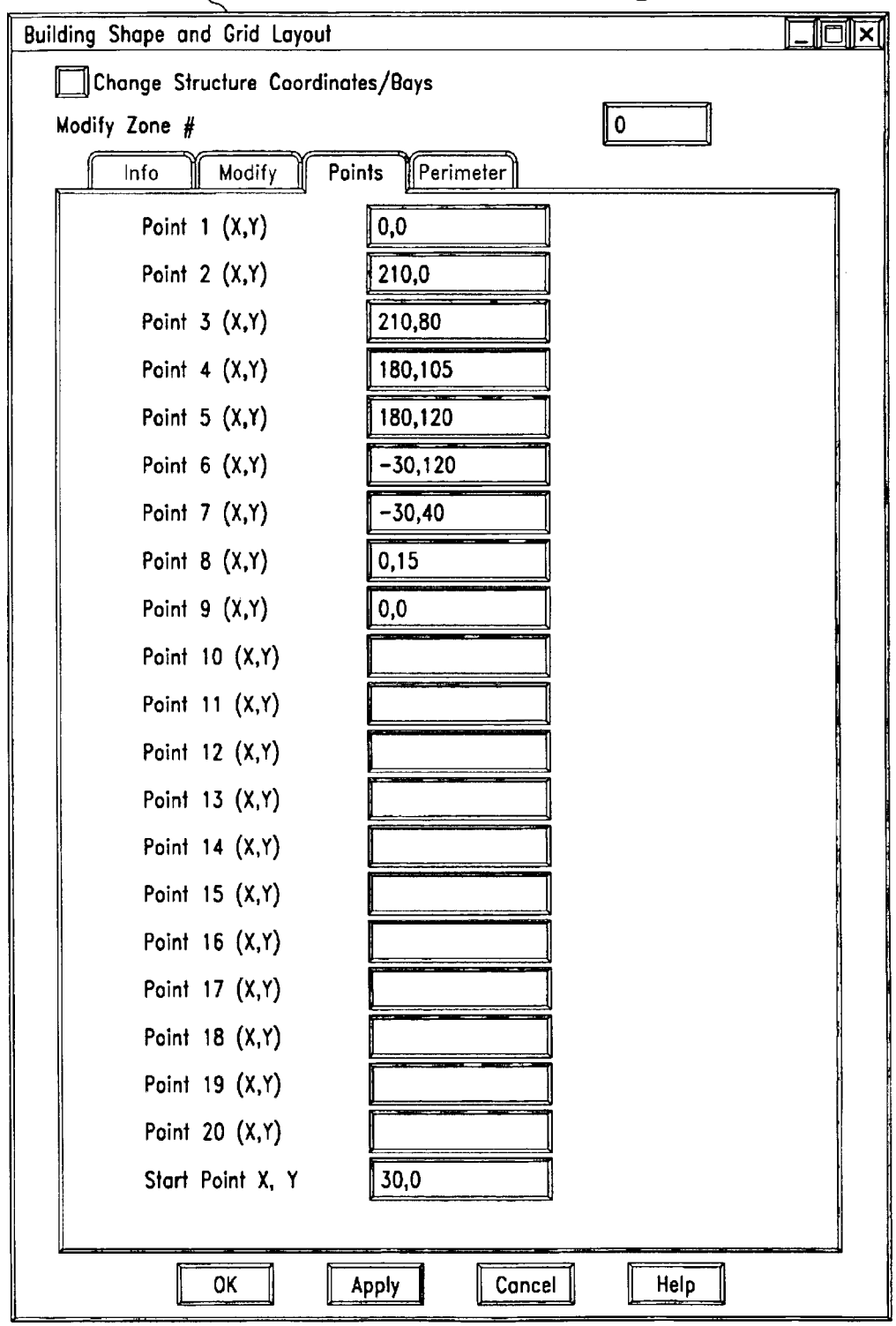

FIG. 4c illustrates a Points tab dialog box 406. As with the Modify tab dialog box 404 (FIG. 4b), when the user selects the building shape from the Info tab dialog box 402 (FIG. 4a), the information on the Points tab dialog box 406 is preassigned. By checking a checkbox designated "Change Structure Coordinates/Bays" located at the top of the dialog box 406, the information on the Points tab dialog box 406 can be changed. The Points tab dialog box 406 enables a user to specify the X and Y coordinates for each zone shape. The user indicates the zone to be modified in a field designated "Modify Zone #" located near the top of the dialog box 406 and then assign corner points for that zone and the location of the start point as it relates to the global origin of the spatial database 118.

Figure 4D:
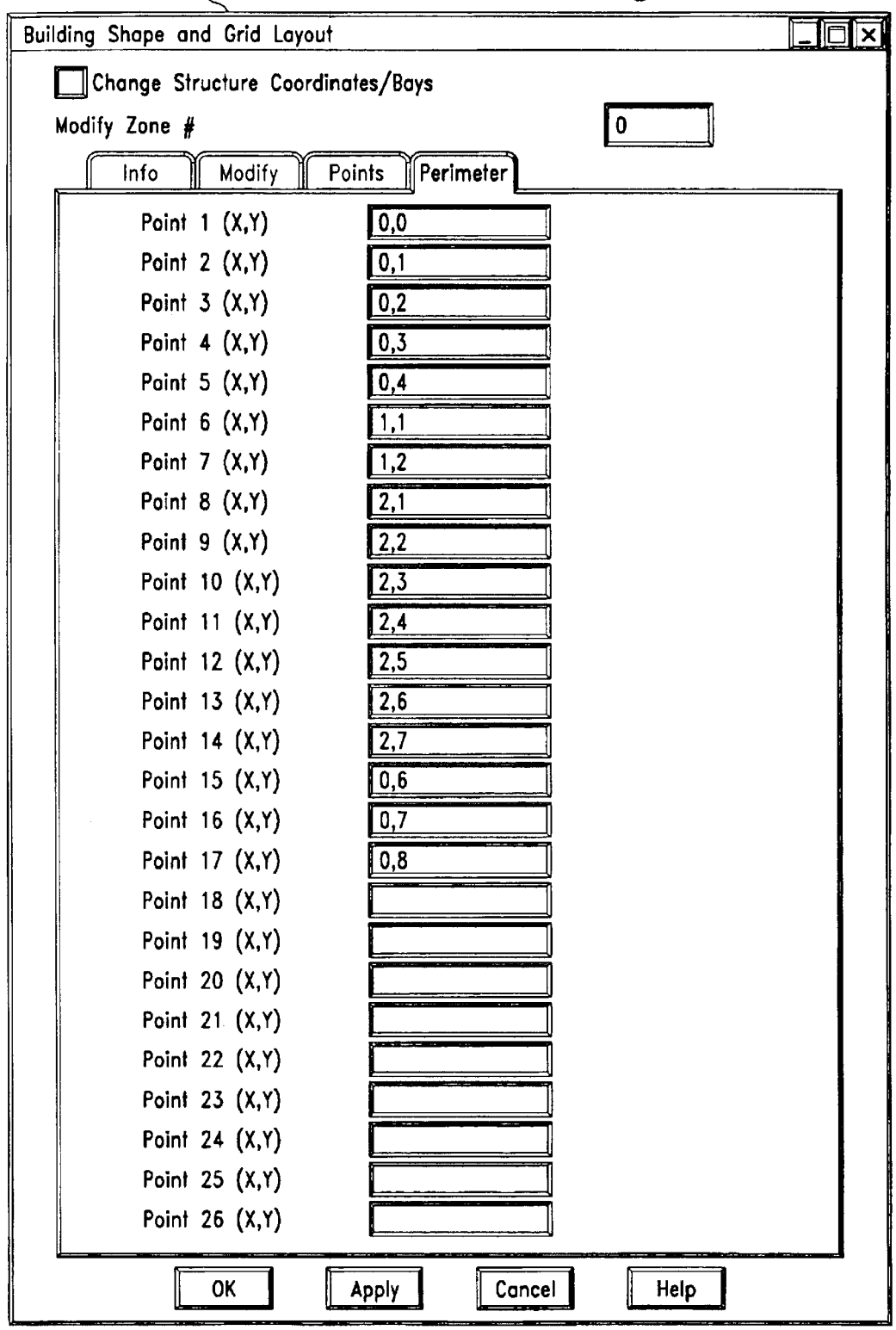
Figure 4E:
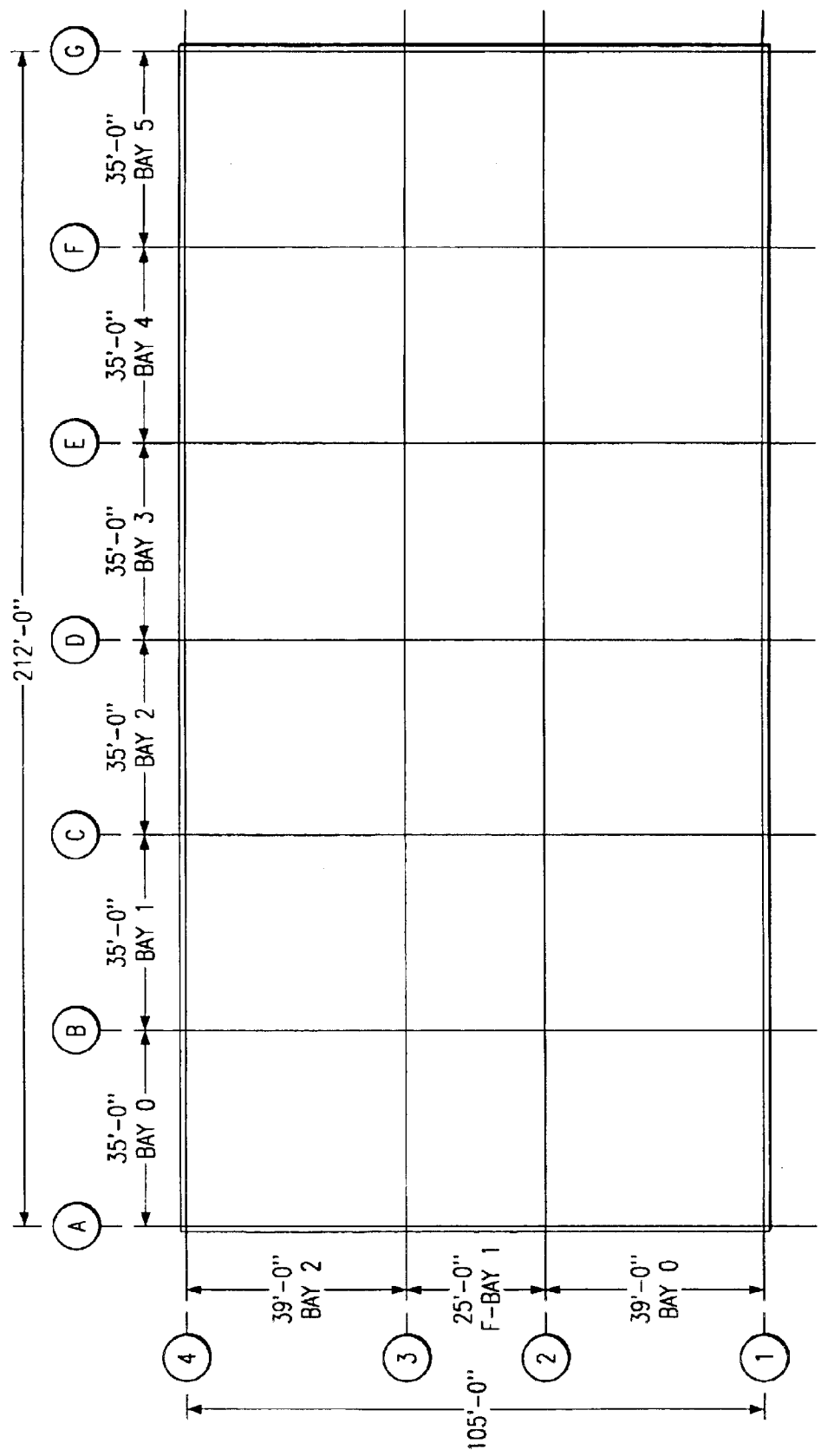
FIG. 4e is a grid layout plan view showing the layout of the grid and outline of the building per the parameters specified using the dialog boxes of FIGS. 4a–4d.

FIG. 4d illustrates a Perimeter tab dialog box 408. As with the Modify tab dialog box 404 (FIG. 4b) and the Points tab dialog box 404 (FIG. 4c), when the user selects the building shape from the Info tab dialog box 402 (FIG. 4a), the information on the Perimeter tab dialog box 408 is preassigned. By checking a checkbox designated "Change Structure Coordinates/Bays" located at the top of the dialog box 408, the information on the Perimeter tab dialog box 408 can be changed. The Perimeter tab dialog box 408 specifies the X and Y coordinates for the perimeter of the total structure. After all zones have been placed together, these points are the points that make up the exterior of the structure.

FIG. 4e is a grid layout plan view showing the layout of the grid with dimensions and the outline of the buildings per the parameters entered using the Building Shape and Grid Layout dialog box shown in FIGS. 4a–4d and used in the Building Shape element calculations.

Figure 4F:
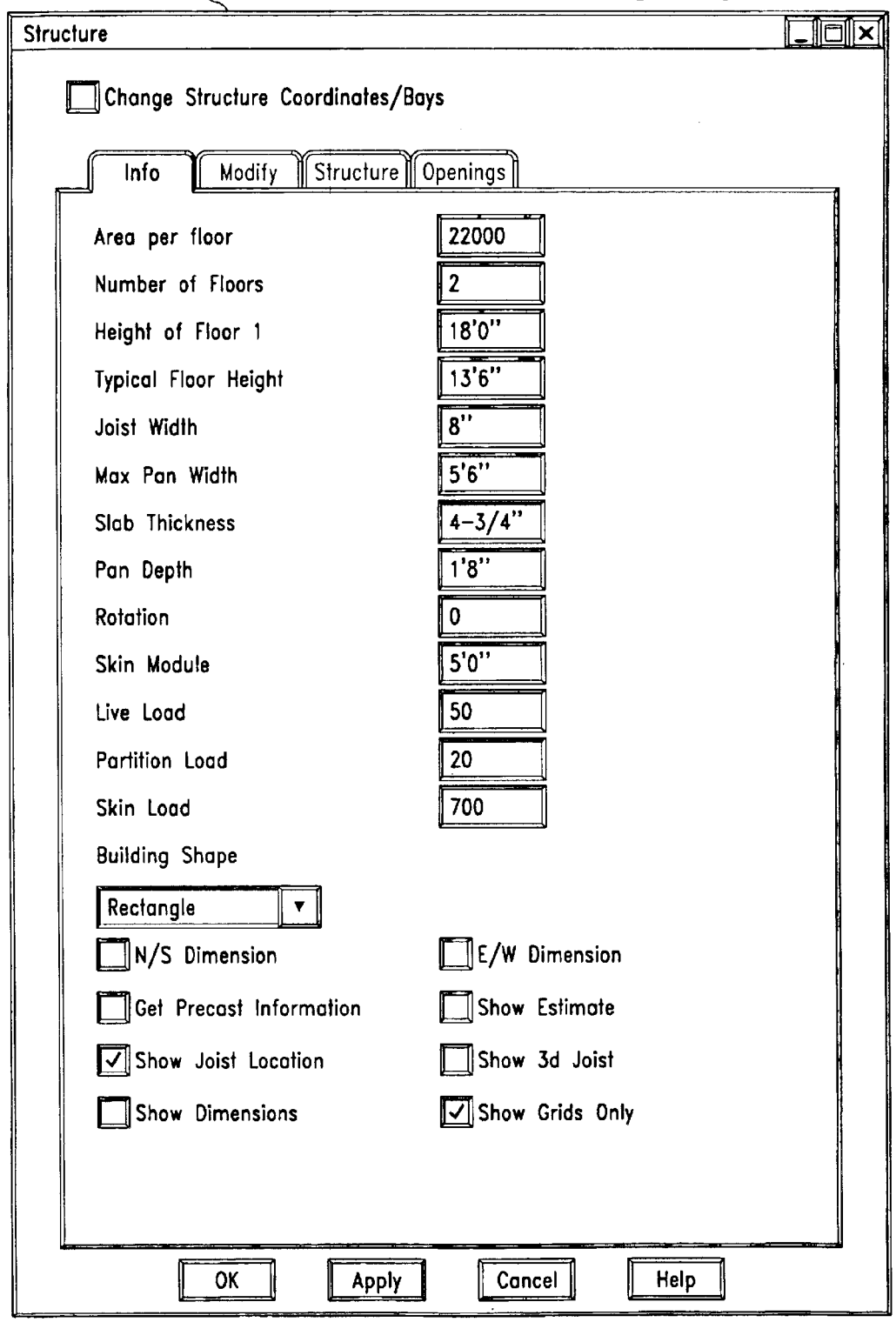
FIGS. 4f–4i illustrate Structure dialog boxes of the DMES system of FIG. 1 for enabling a user to specify design loads in connection with the building to be designed and modeled.

As shown in FIGS. 4f–4i, a Structure dialog box, illustrated in FIGS. 4f–4i, is very similar to the Building Shape and Grid Layout dialog box (FIGS. 4a–4d). It will be recognized that the Structure dialog box is associated with the Structural massing element 204b (FIG. 2b) and is used to input data thereto. The Info tab dialog box 402 (FIG. 4a) sends its information to the Structure dialog box and causes certain information to be preassigned. As shown in FIG. 4f, using an Info tab dialog box 420, the user can override the preassigned information and can change concrete joist width, maximum pan widths and slab thickness by making entries in the appropriate fields. The design loads that are to be used for the live load, partition loads, and skin loads can also be manipulated using the Info tab dialog box 420.

Figure 4G:
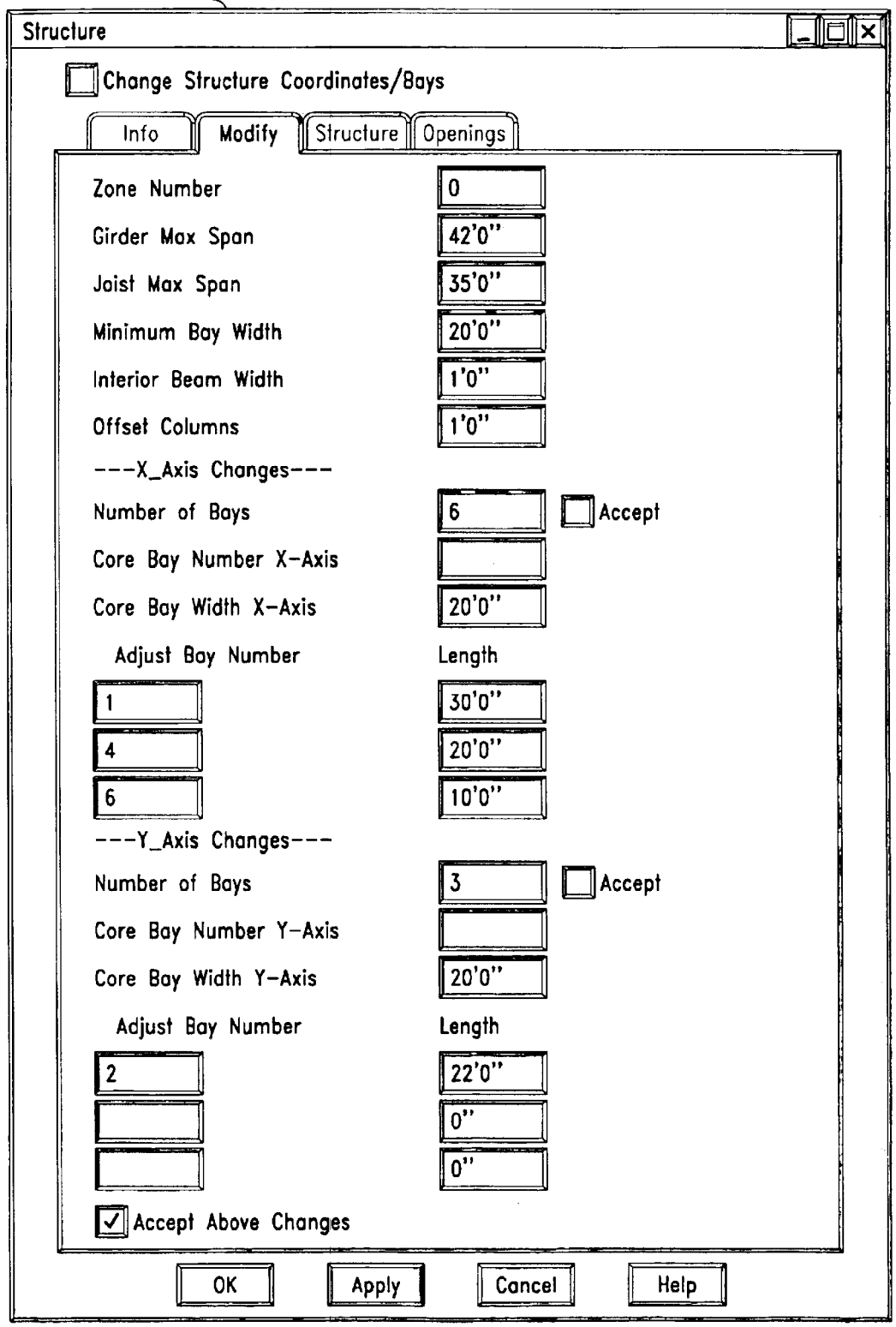
Figure 4H:
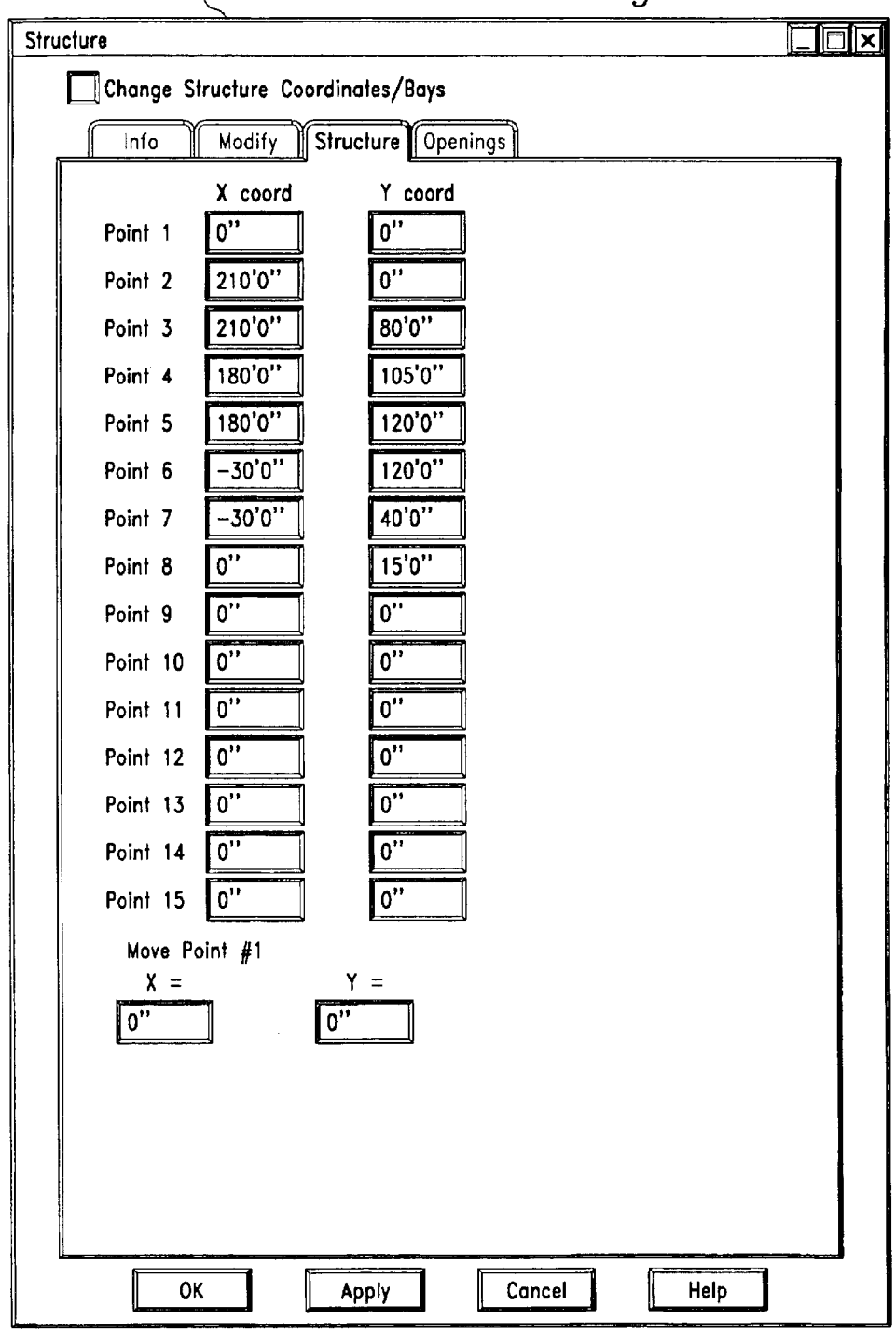

FIGS. 4g and 4h respectively illustrate a Modify tab dialog box 422 and a Structure tab dialog box 424, which are similar to the Modify tab dialog box 404 (FIG. 4b) and the Points tab dialog box 406 (FIG. 4c), respectively. The user can make changes using these dialog boxes 422, 424, that will override the information entered using the Building Shape and Grid Layout dialog boxes shown in FIGS. 4a–4d.

Figure 4I:
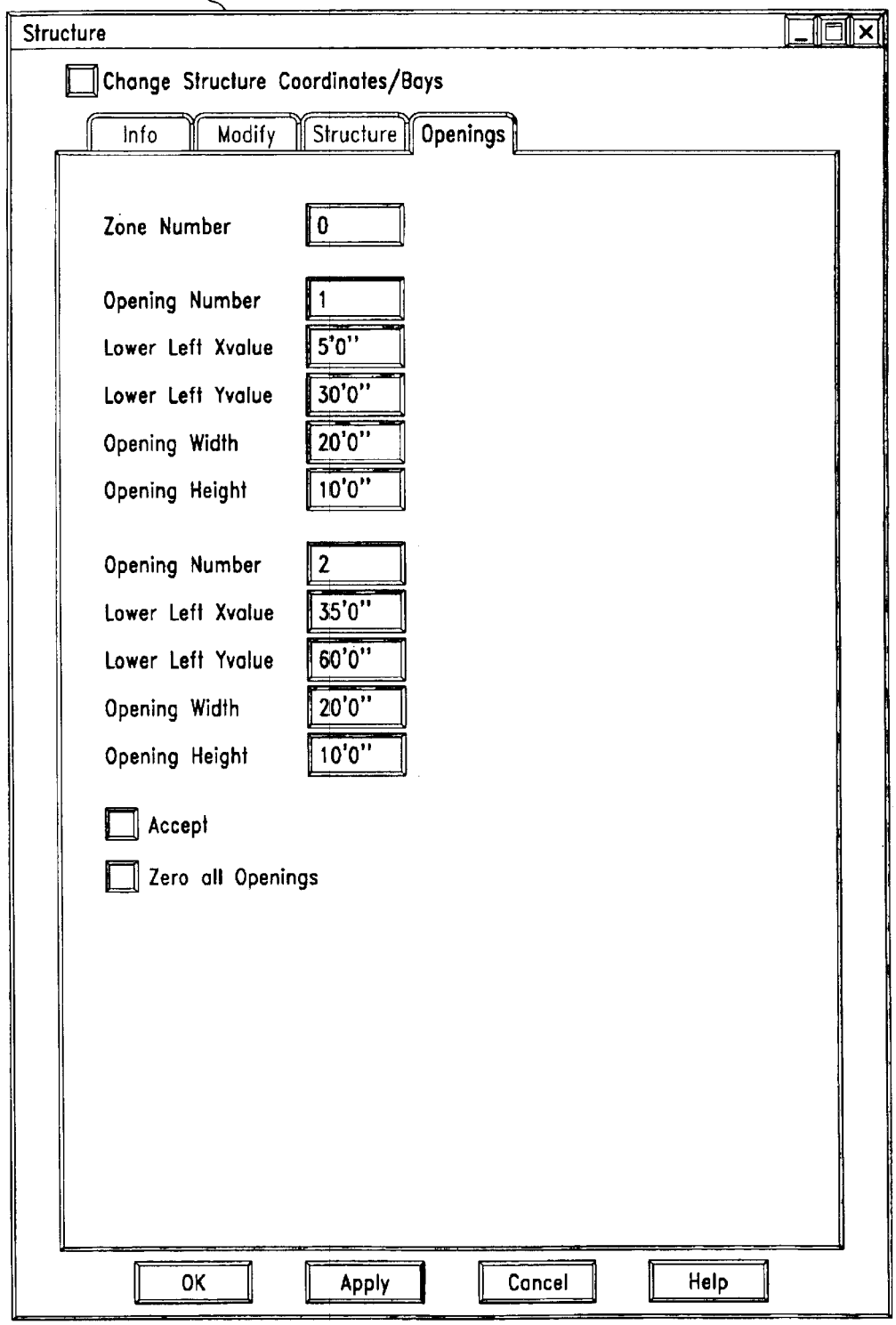

FIG. 4i illustrates an Openings tab dialog box 426 that is used to locate the openings in the structural slab. Using the Openings tab dialog box 426, the user inputs the bottom left X and Y coordinates of the opening, as well as the length and width of the opening, and the structure will lay out the joist and beams around the location. When the Structure element is used in conjunction with the Interview massing element 201, the location and size of the openings are passed to the Structure element, which then uses the information to design the structure.

Figure 4J:
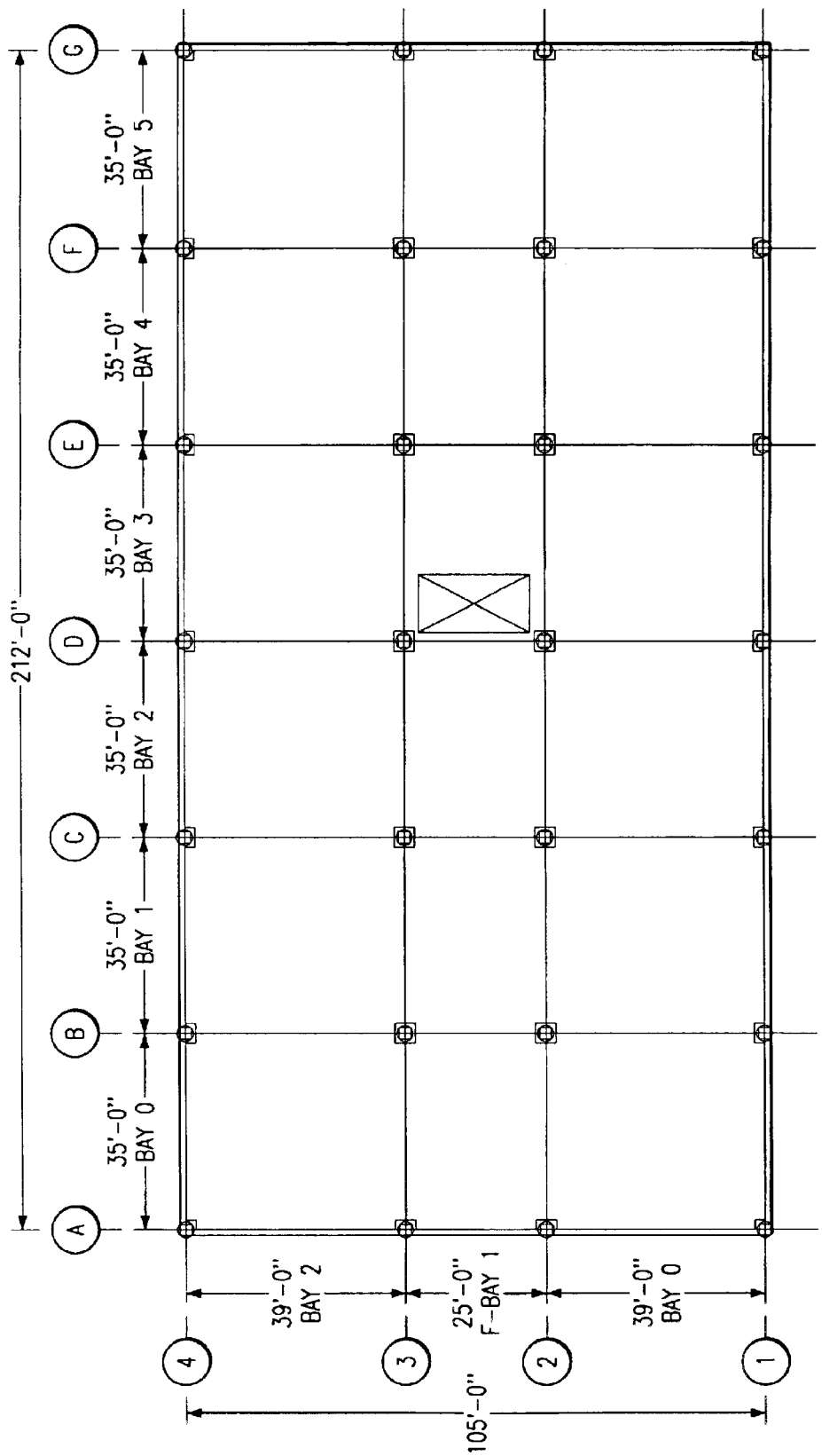
FIG. 4*j* illustrates a first floor plan view showing the layout of the building at the first floor level per the parameters specified using the dialog boxes of FIGS. 4*f*–4*i*.

FIG. 4j illustrates a First Floor Plan View showing the layout of the piers, grade beams, and columns at the first floor level per the parameters entered using the dialog boxes shown in FIGS. 4f through 4i and used in the Structural element 204b calculations.

Figure 4K:
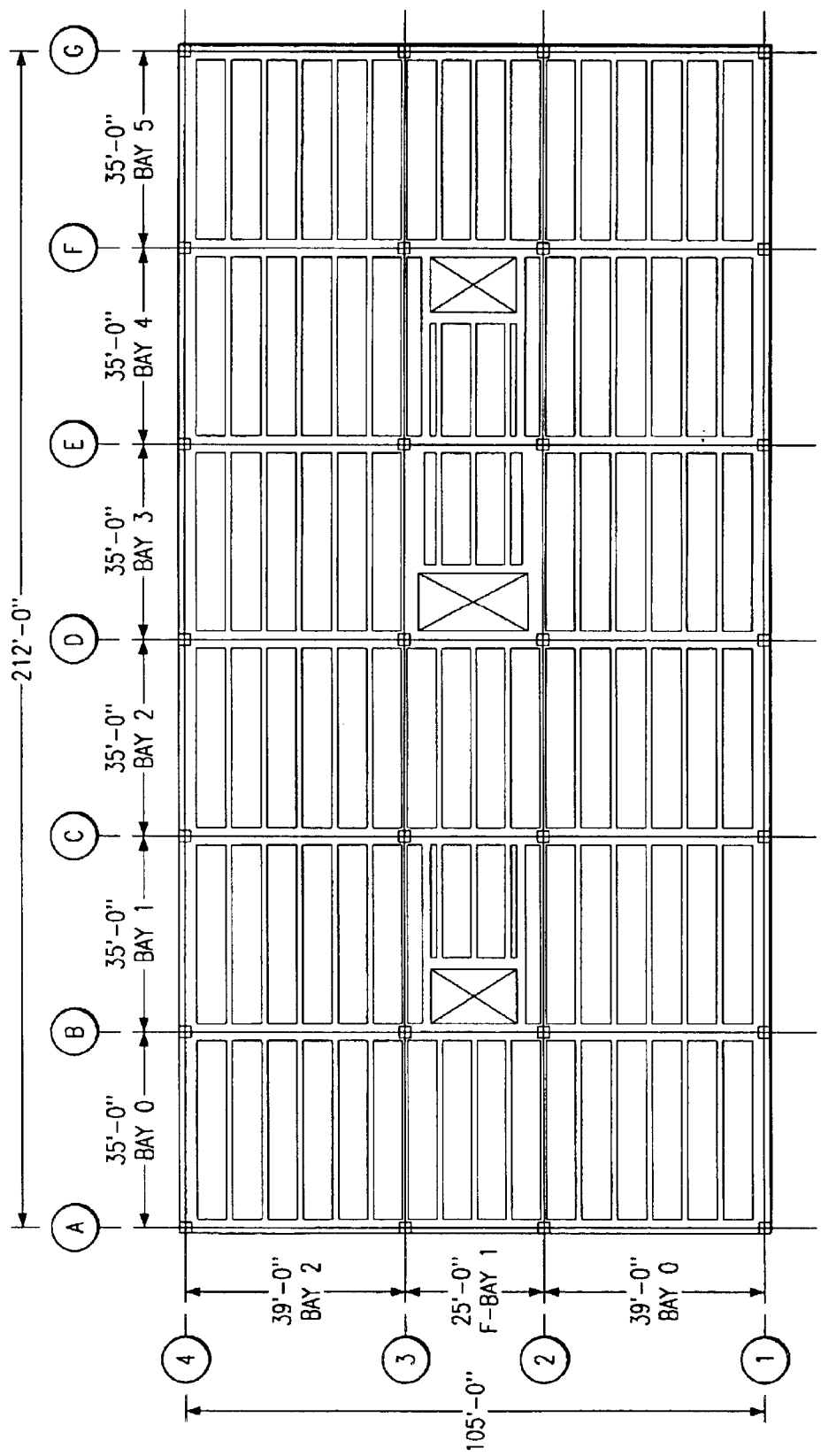
FIG. 4*k* illustrates a typical floor plan view showing the layout of the building at a typical floor level per the parameters specified using the dialog boxes of FIGS. 4*f*–4*i*.

FIG. 4k illustrates a Typical Floor Plan View showing the layout of the beams, girders, joist, columns, and openings at a typical floor level per the parameters entered using the dialog boxes shown in FIGS. 4f through 4i and used in the Structural Element calculations.

Figure 4L:
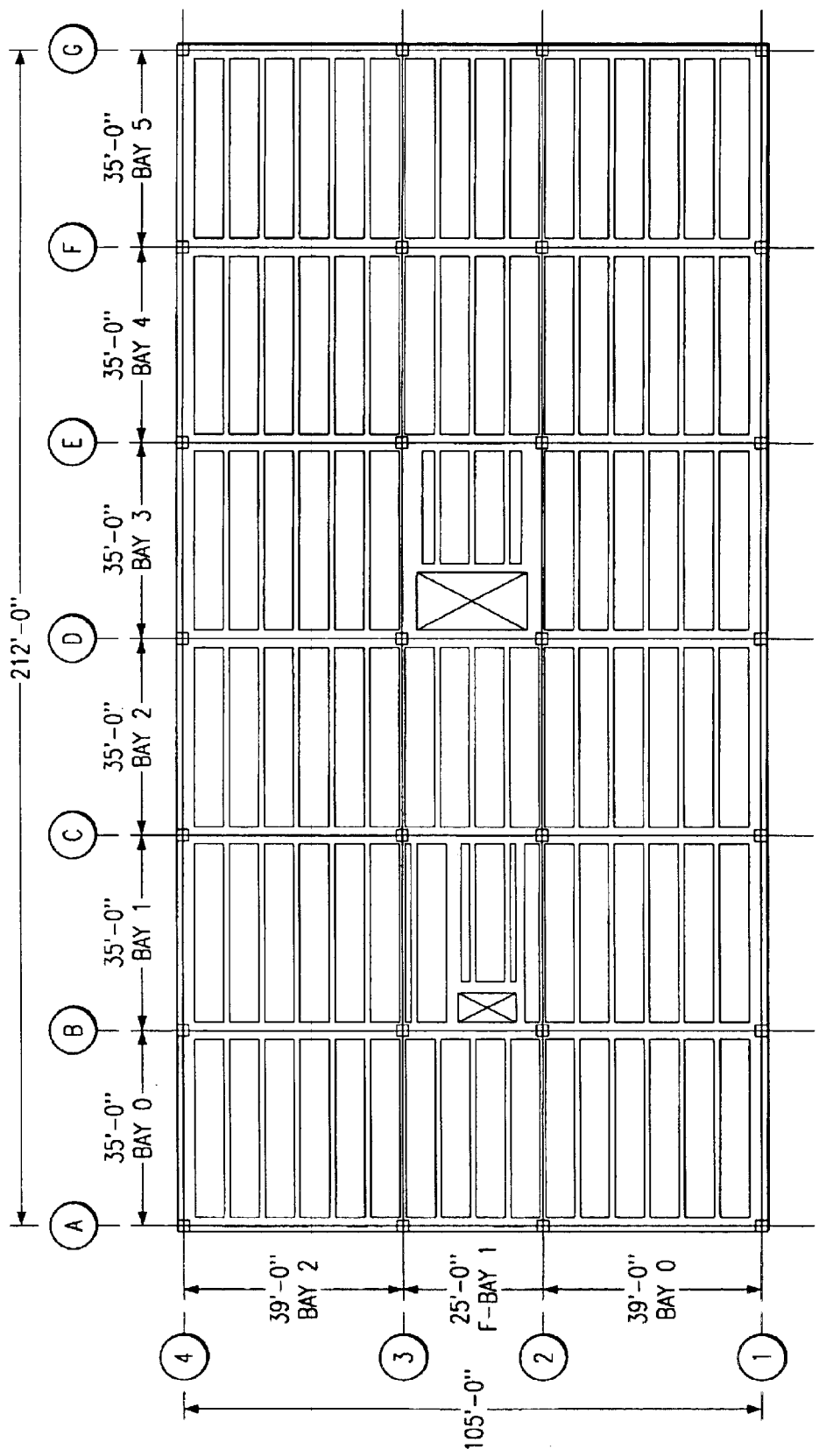
FIG. 4*l* illustrates a roof plan view showing the layout of the building at the roof level per the parameters specified using the dialog boxes of FIGS. 4*f*–4*i*.

FIG. 4l illustrates a Roof Plan View showing the layout of the beams, girders, LC joist, columns, and openings at a roof level per the parameters entered using the dialog boxes shown in FIGS. 4f through 4i and used in the Structural Element calculations.

Figure 4M:
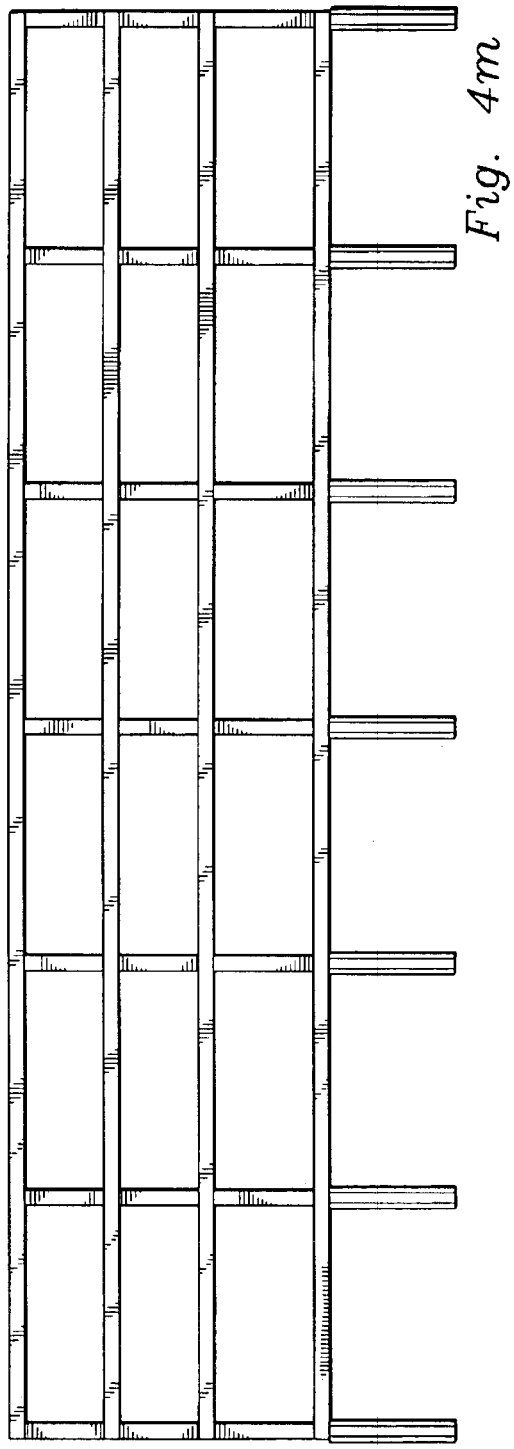
FIGS. 4*m* and 4*n* respectively illustrate front and end elevation views showing the layout of the building structure per the parameters specified using the dialog boxes of FIGS. 4*f*–4*i*.
Figure 4N:
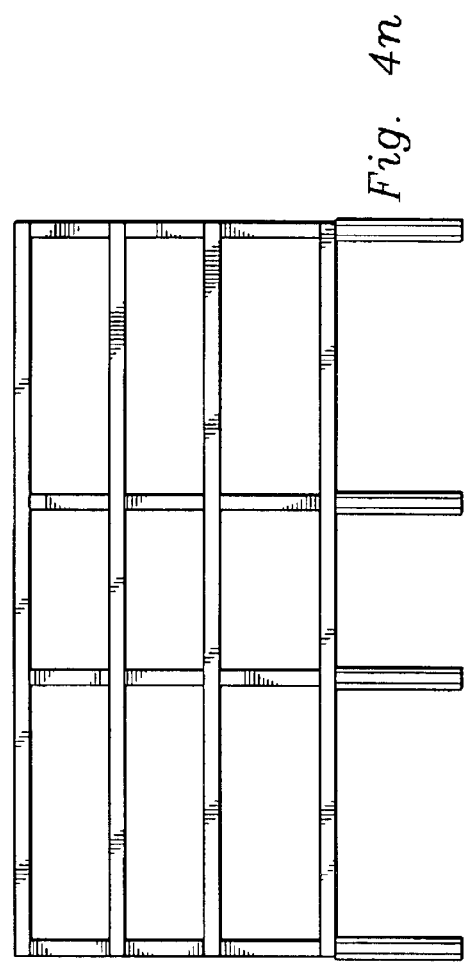
Figure 40:
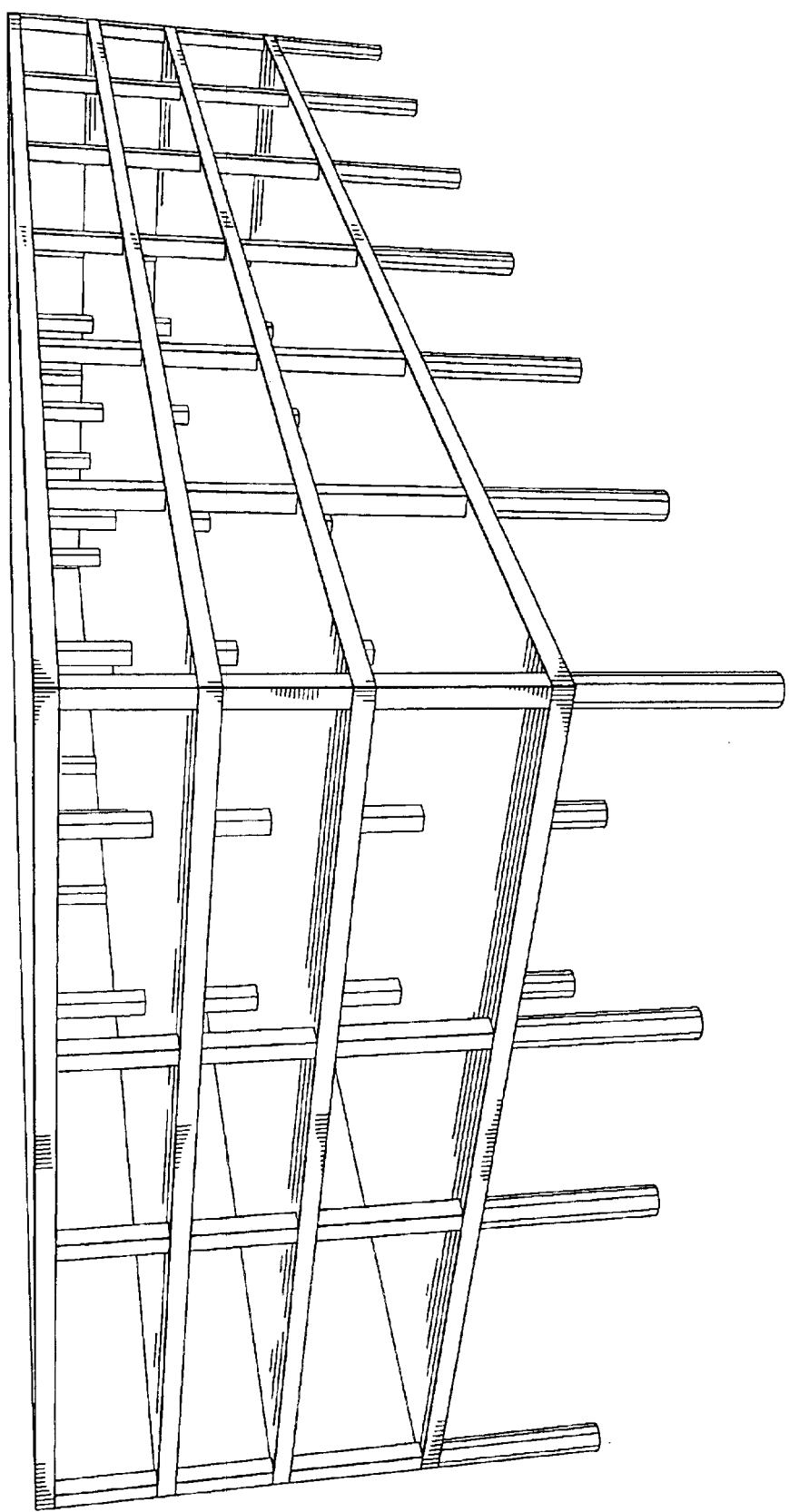

FIGS. 4m and 4n respectively illustrate a Front Elevation View and an End Elevation View showing the layout of the beams and columns per the parameters entered using the dialog boxes shown in FIGS. 4f through 4i and used in the Structural Element calculations.

FIG. 4o illustrates a Perspective View showing the layout of the beams and columns per the parameters entered using the dialog boxes shown in FIGS. 4f through 4i and used in the Structural Element calculations.

Figure 5A:
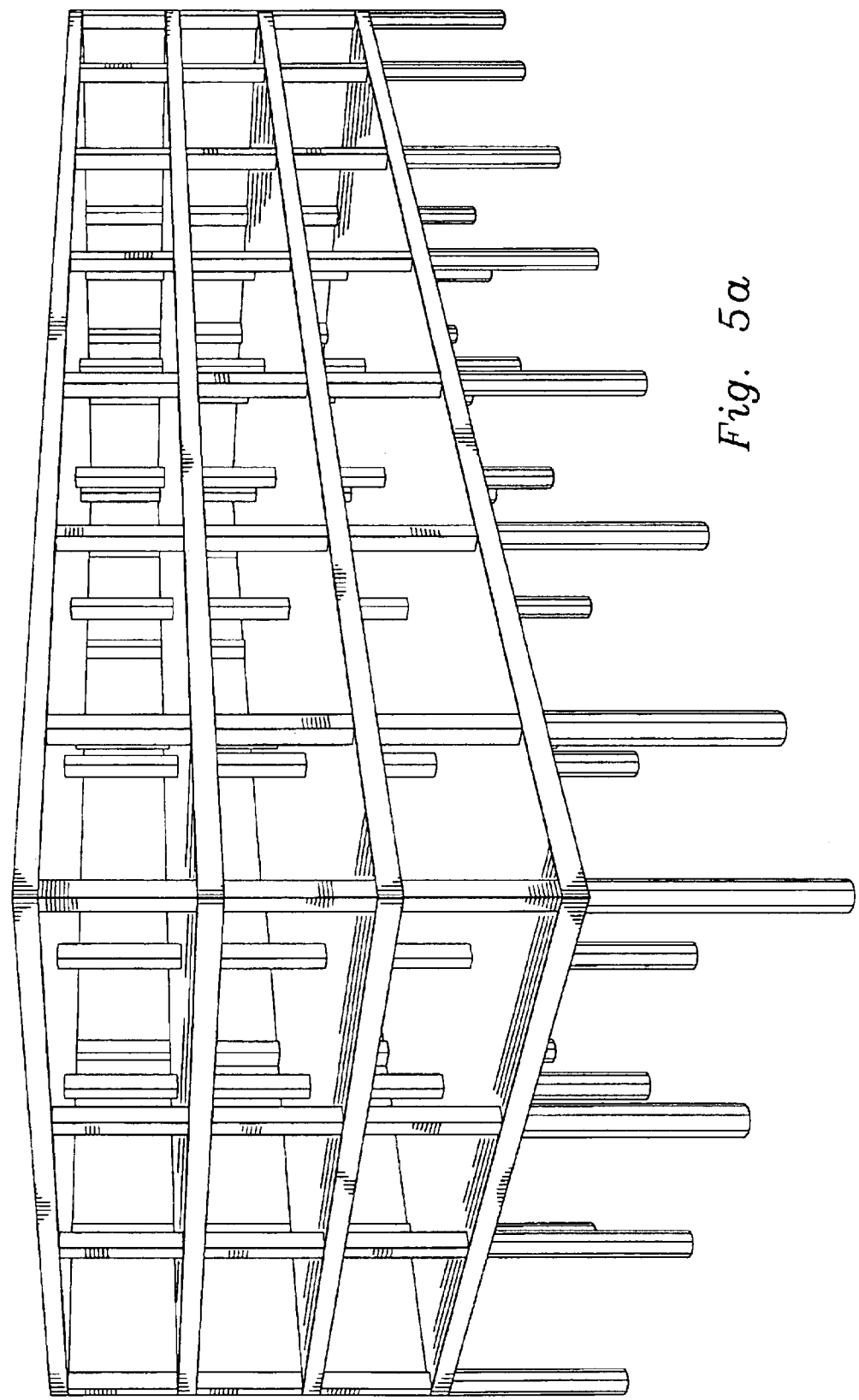
Figure 5B:
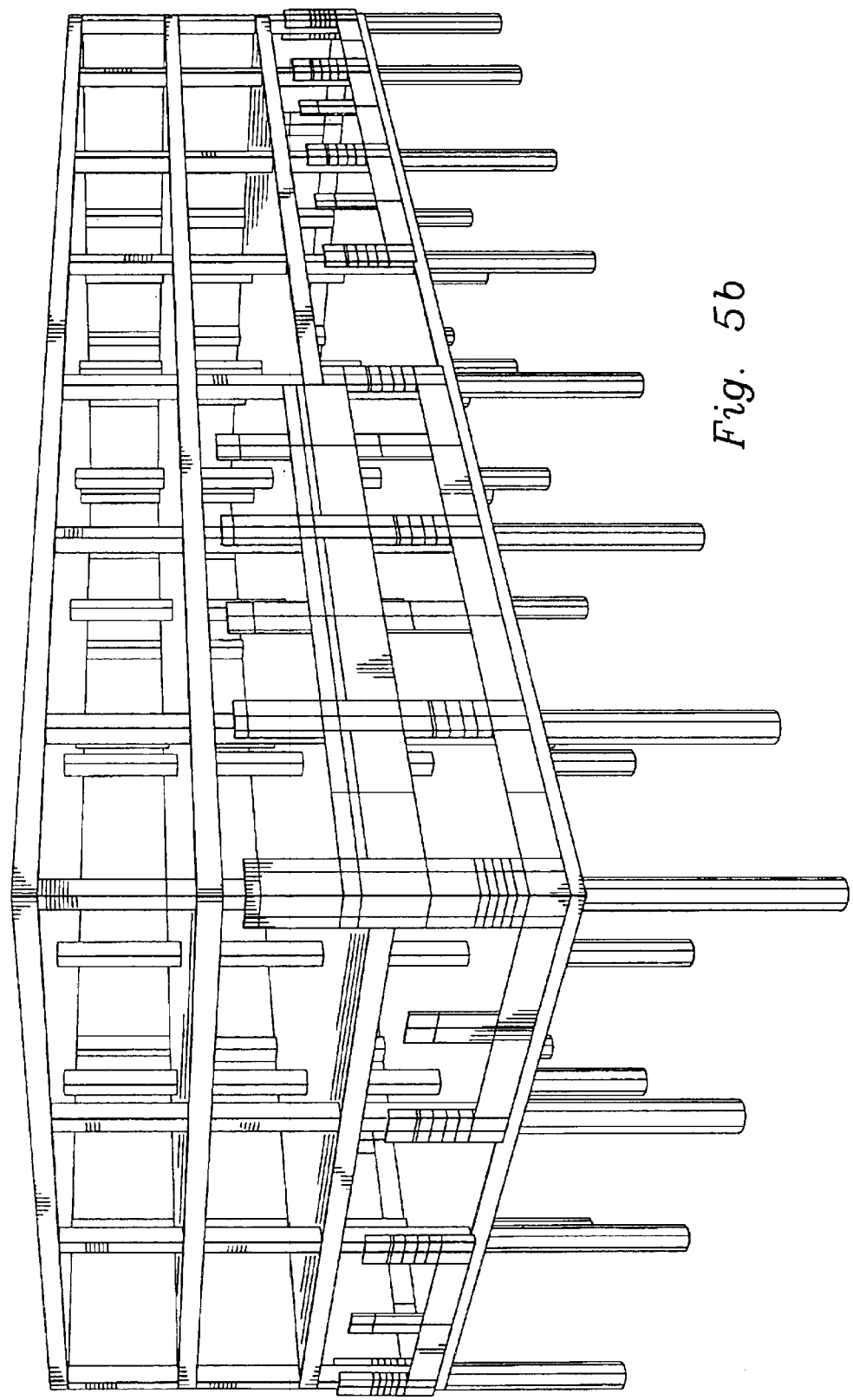
Figure 5C:
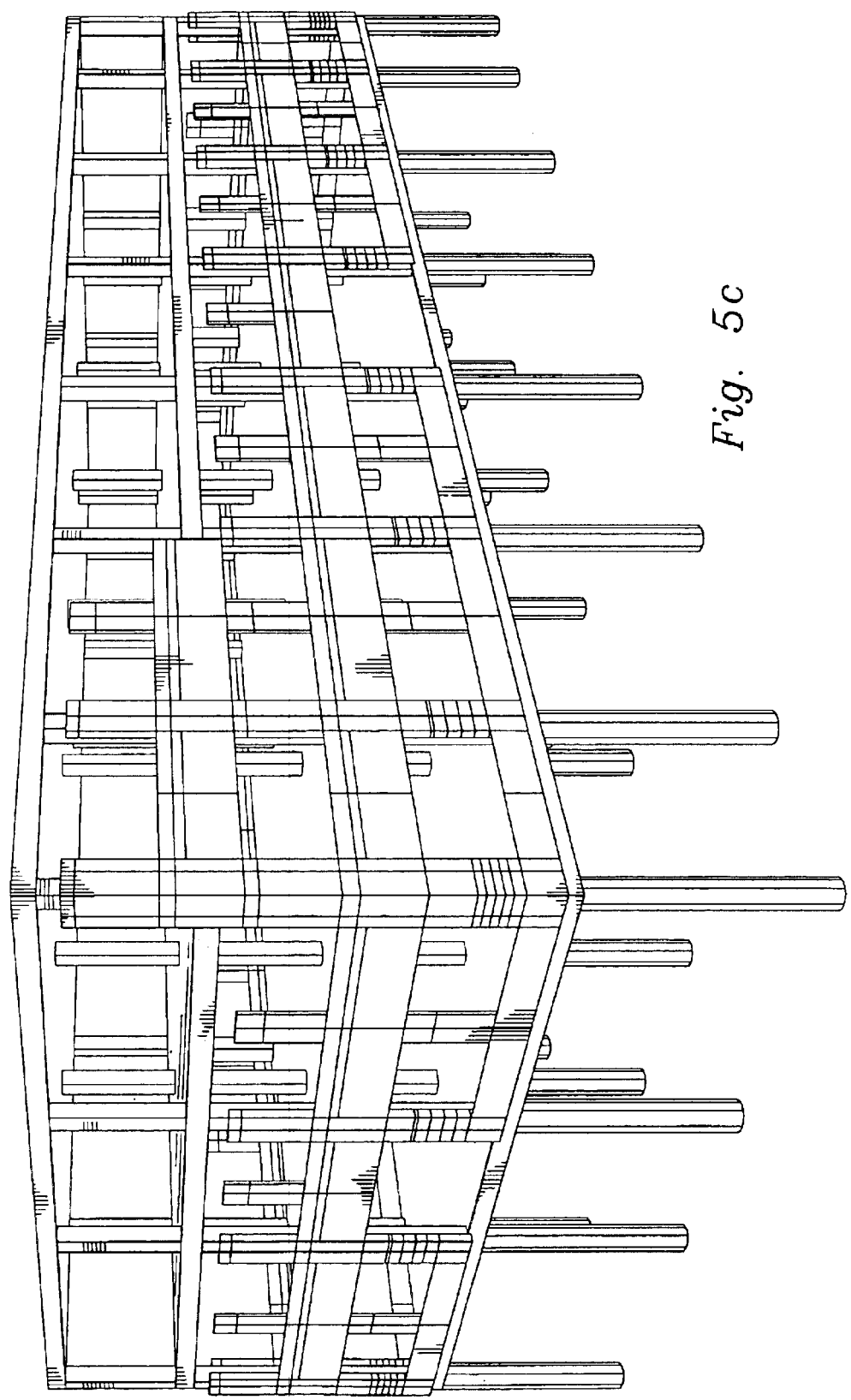
Figure 5D:
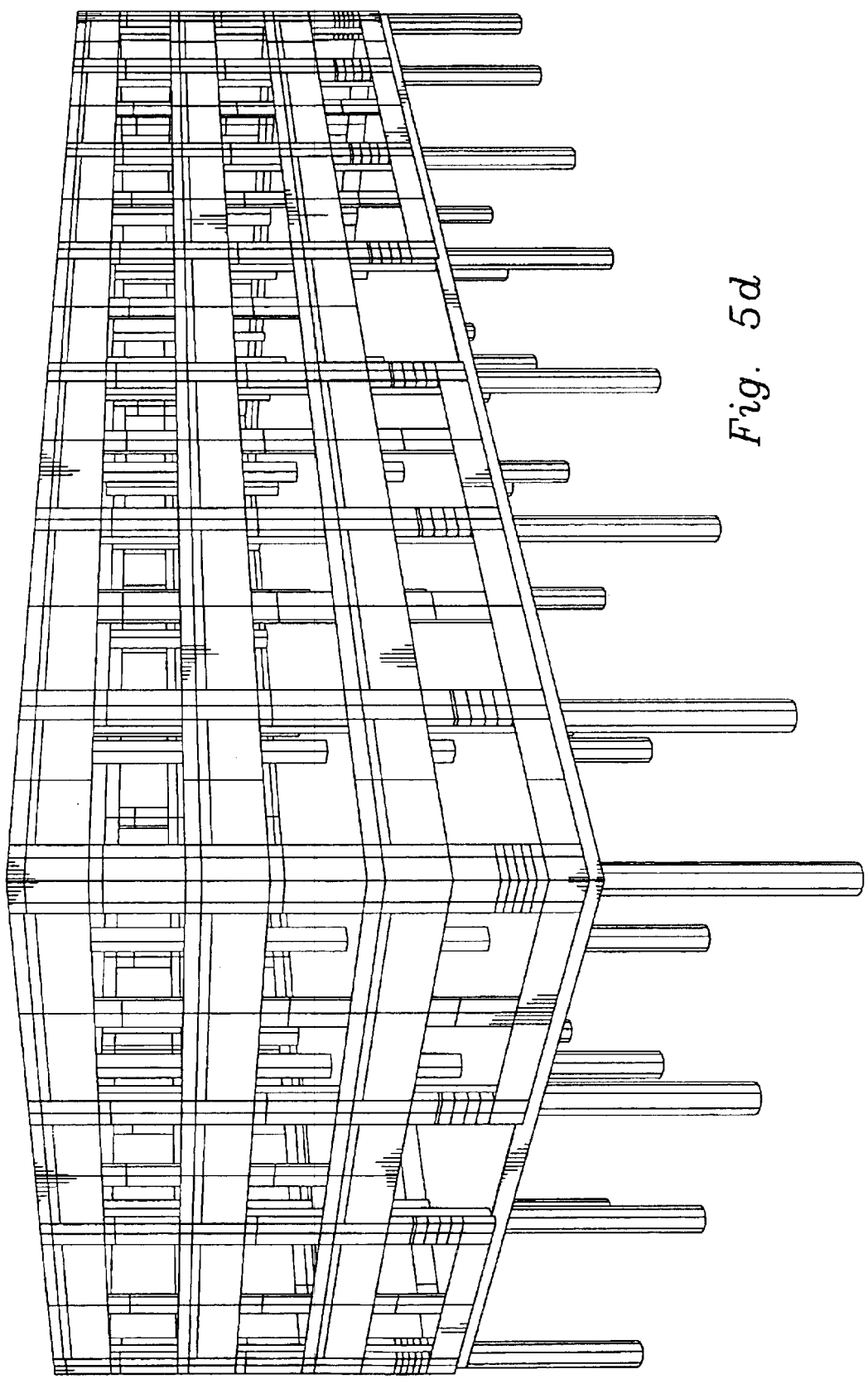
Figure 5E:
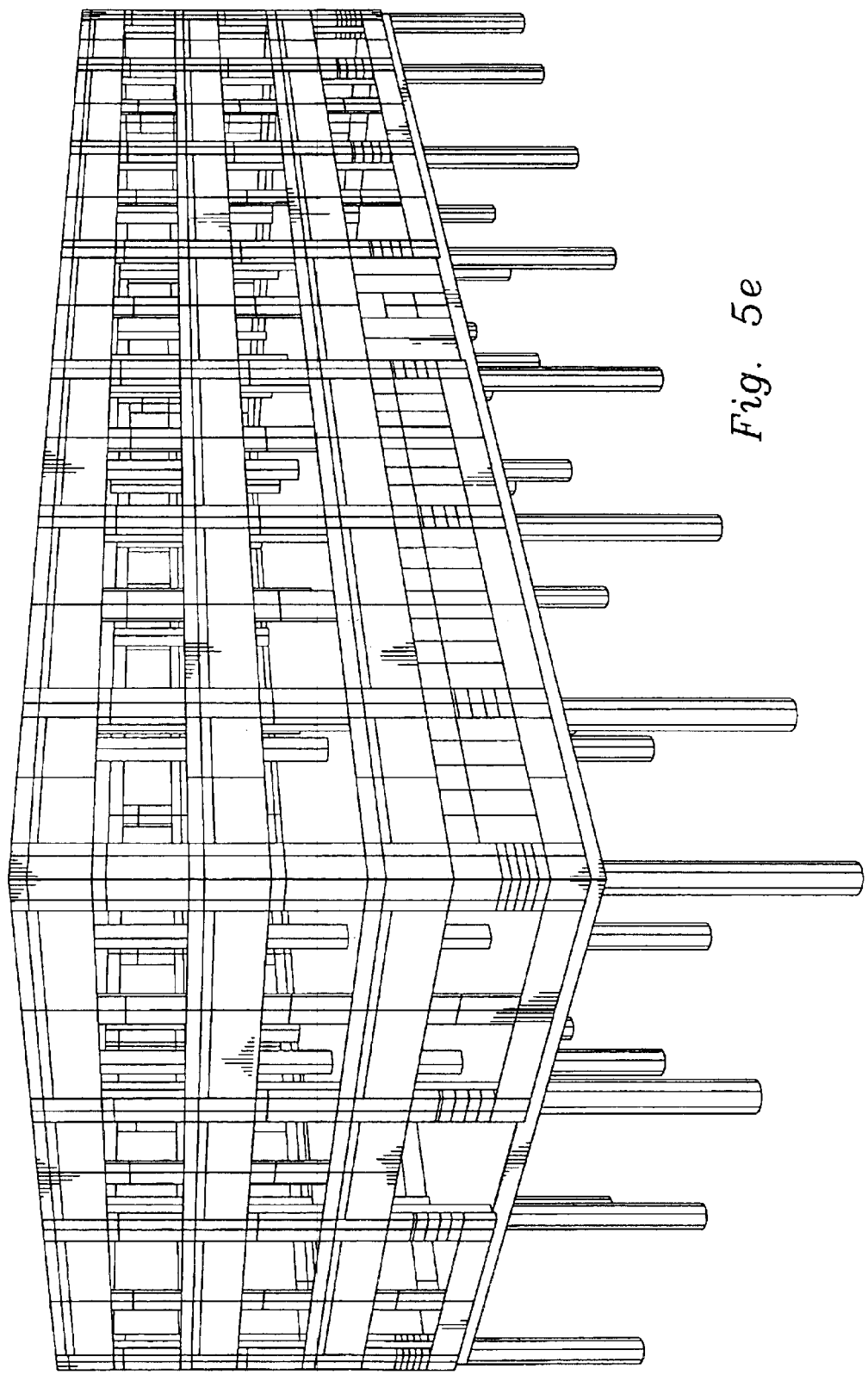
Figure 5F:
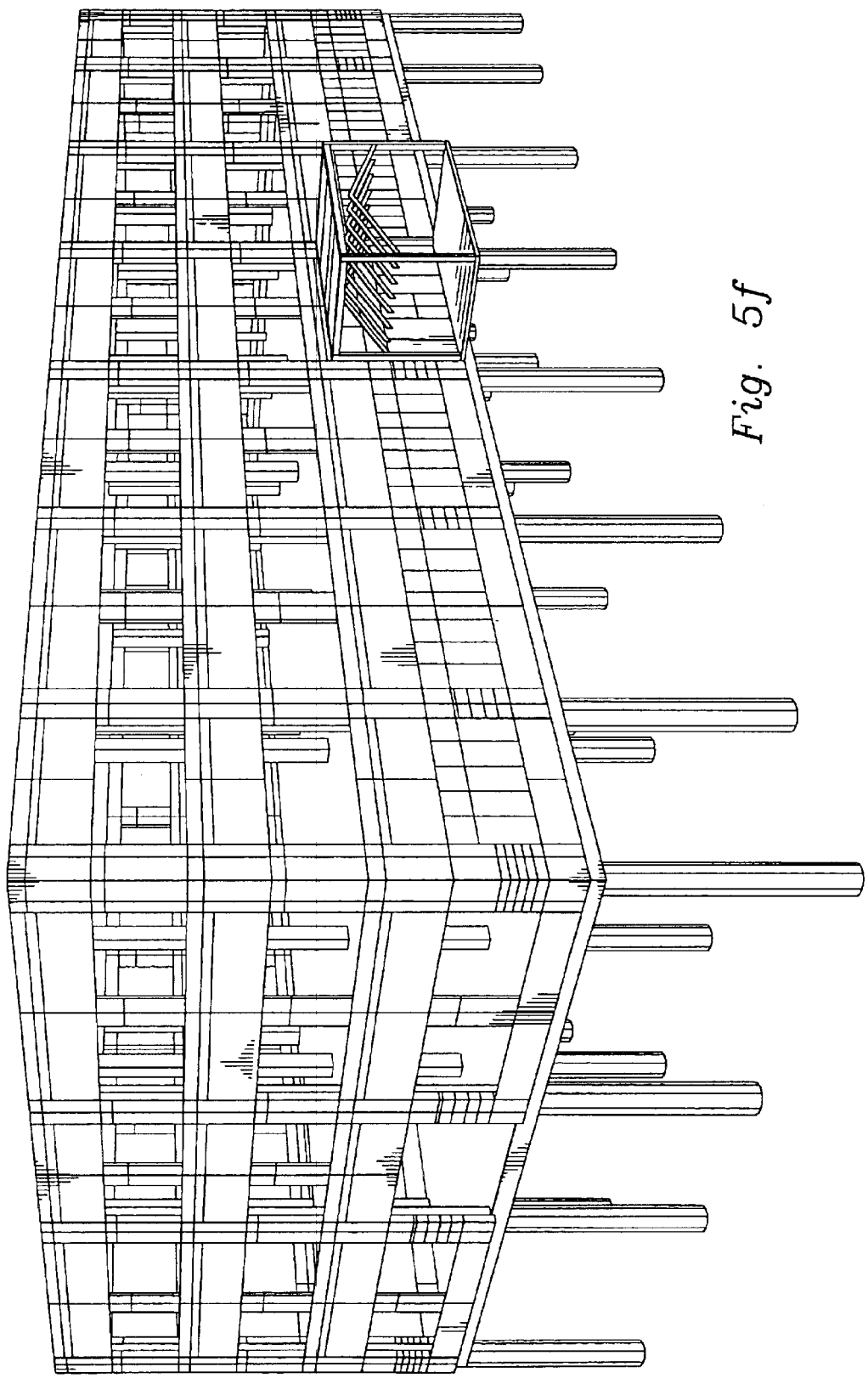
Figure 5G:
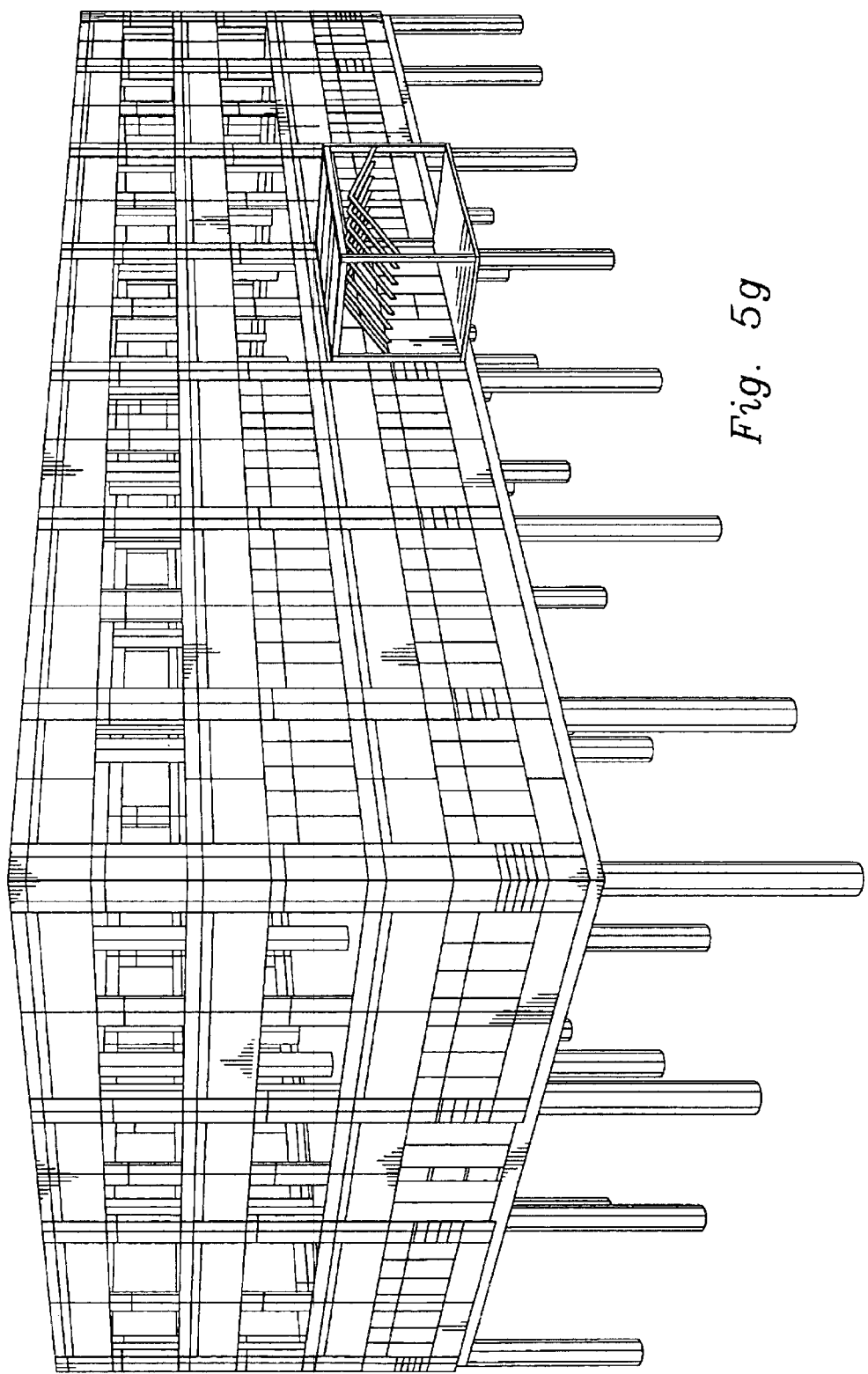
Figure 5H:
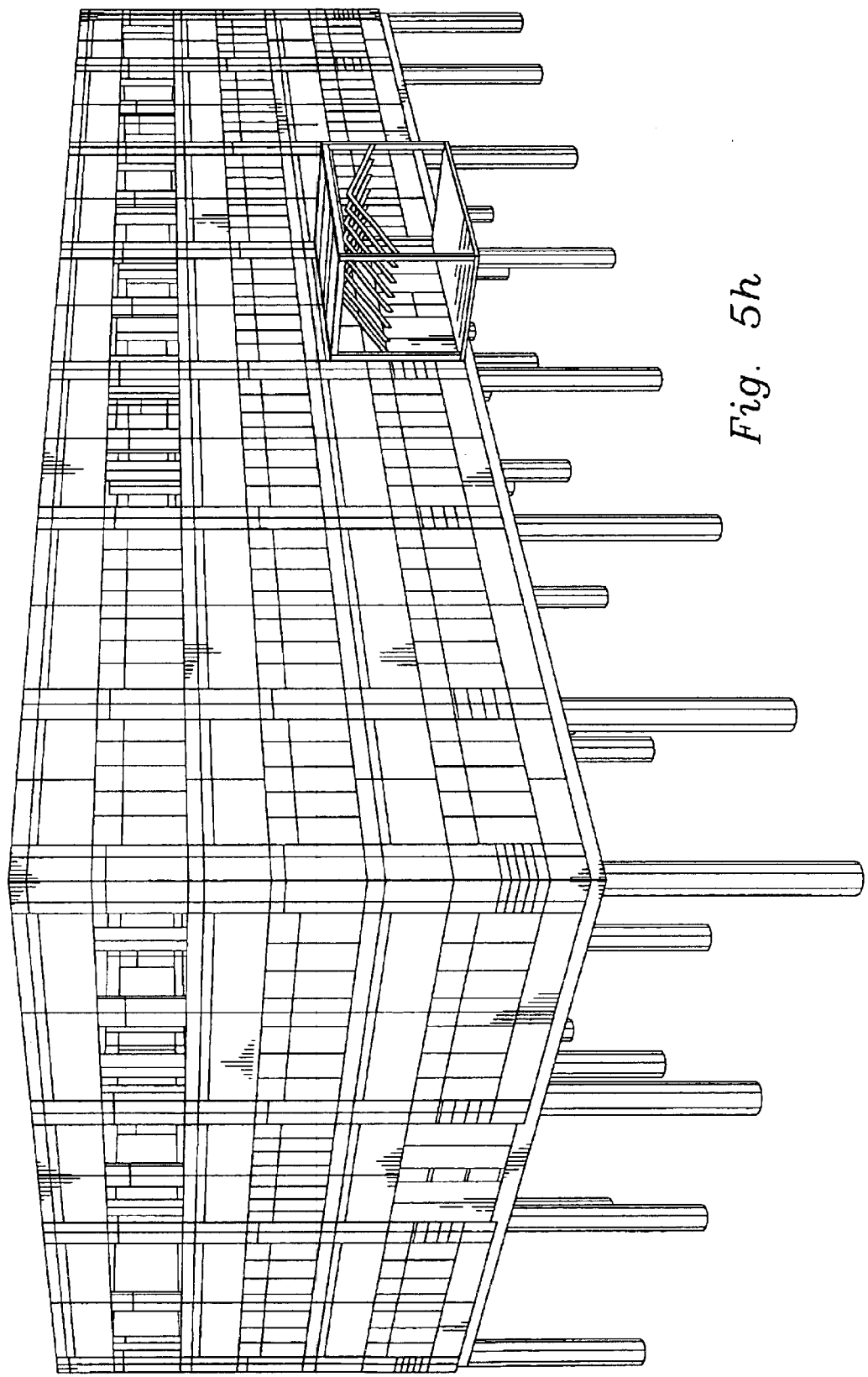
Figure 5I:
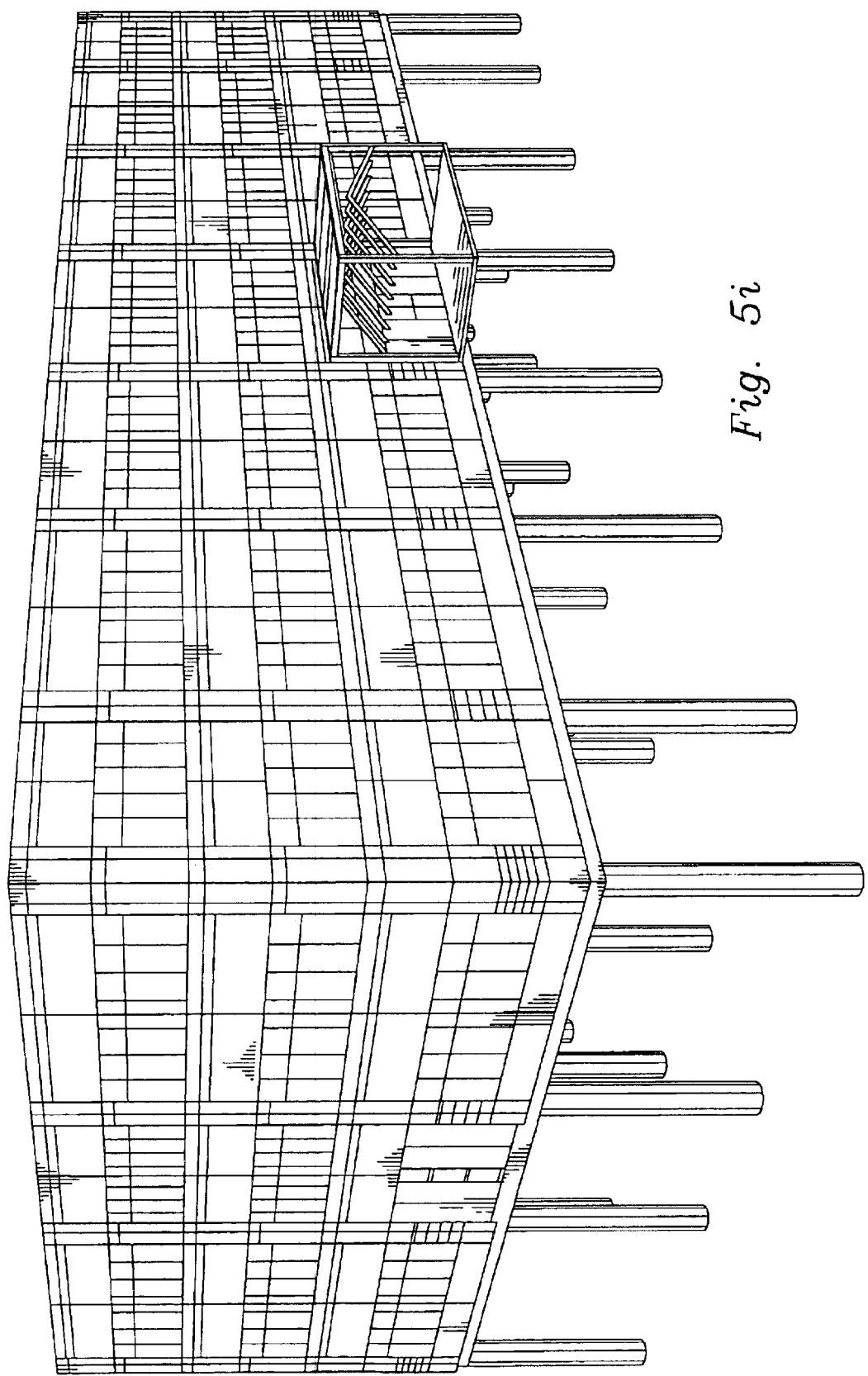
Figure 5J:
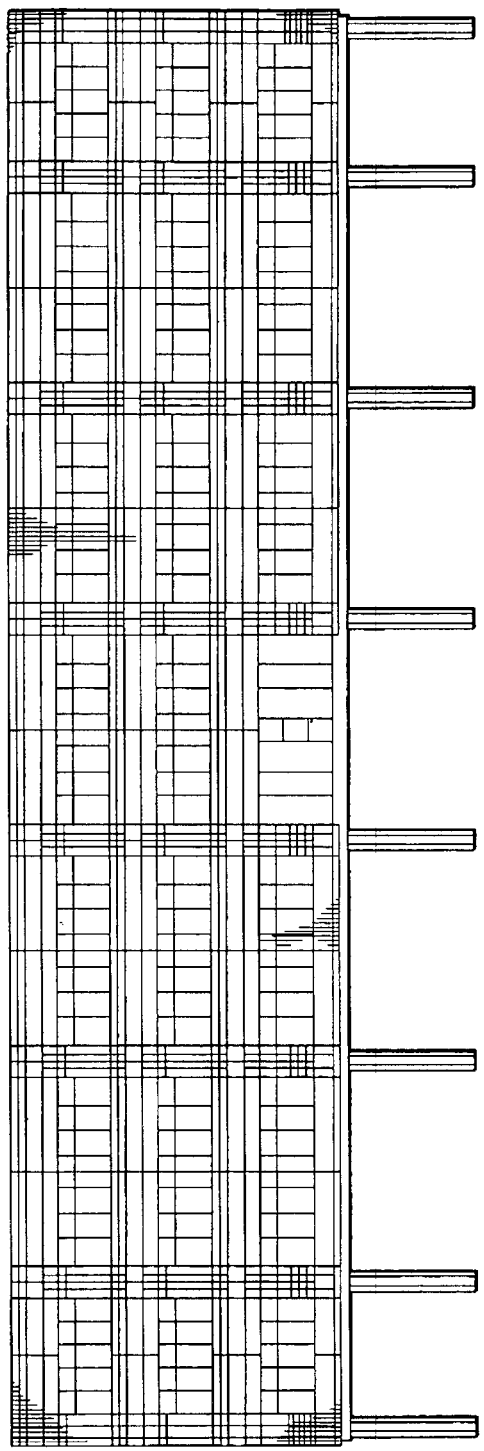
Figure 5K:
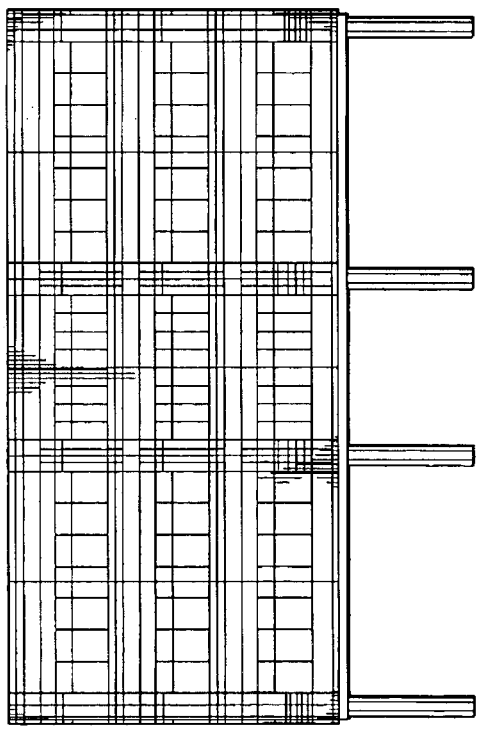
Figure 51:
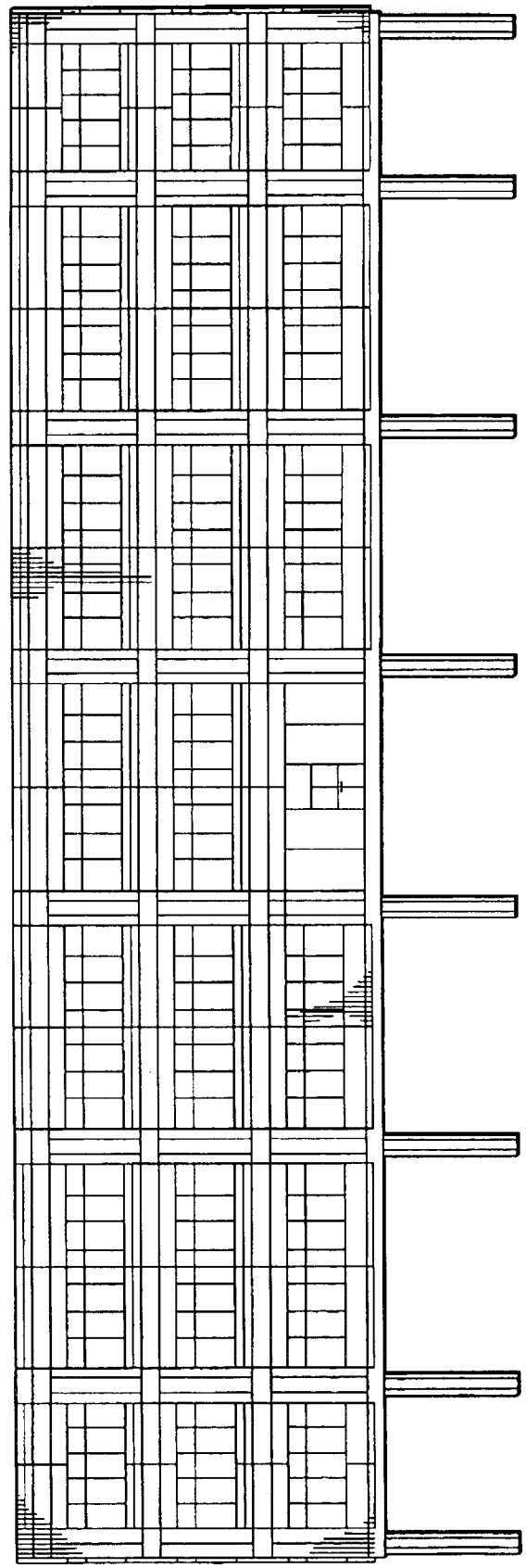

As previously described, as the building model is assembled in the memory device 180, it can also be displayed on the display 179. FIGS. 5a–5l illustrate this process for a three-story building. FIG. 5a is a perspective view of a completed three-story reinforced concrete structural frame consisting of girder and joist slabs, piers, columns and beams. FIGS. 5b–5d illustrate the assembly of precast concrete cladding on the building structure of FIG. 5a. As evident from FIGS. 5b–5d, the cladding is assembled around the perimeter of the structural frame floor-by-floor, one bay at a time. Th cladding consists of spandrel panels, column covers, corner column cover units, and false column covers.

FIGS. 5e–5h illustrates the addition of a punched window system to the structure of FIG. 5d. The punched window system assembles in openings in the precast cladding system, also floor-by-floor, one bay at a time. The punched window system consists of horizontal and vertical mullions with glazed lights and gaskets. Store front entrance doors and associated sidelights and canopies, where appropriate, are assembled in the entrance lobby locations. A parapet wall is placed behind the roof precast panels with coping over the assembly at the roof parapet. Finally, FIGS. 5i–5l respectively show perspective, rear elevation, side elevation, and front elevational views of the completed building showing precast and glazing cladding to structure.

In one aspect, of the invention, the DMES system is capable of using fixed, non-parametric graphical objects as components of the building model while gathering useful information from them. This is achieved through use of a parametric massing element, referred to as a grouping massing element, that has the ability to assemble any single instance or grouped instances of elements. Each grouping massing element assembled in the model contains the names of the element or elements it in turn has assembled in the model. The grouping massing element also contains functions that store specific information about the various elements it may be assembling, along with functionality and calculations associated with those elements. The grouping massing element therefore contains the parametric behavior required of the elements it assembles in the model, and those elements can therefore either be parametric or use fixed, non-parametric graphical elements. The result is that non-parametric graphical elements may be transferred into the database of the DMES system 110 from traditional CAD systems and those elements can be added to the element hierarchy used to assemble the building model. The high-level functionality can be added to these non-parametric elements when they are automatically assembled into the building model.

In another aspect, once the building configuration is determined, the steel reinforcement bar, or "rebar", system, i.e., the reinforcing steel and size of each girder, beam, joist and pier, will be automatically designed by the DMES system 110. The live load requirements are sent to the Structural massing element 204b (FIG. 2a) are based on the building design. The Structural massing element 204b then calculates the load area of each structural member and applies the live loads, dead loads, point loads and any other load within that area to that member. The deflections, shears, and moments induced by these loads and the effects of loads on adjacent bays up to two spans are computed according to accepted engineering practice. From these computations, the member size and reinforcing steel size, spacing, configuration and location are determined. Any changes made to the design parameters will result in a redesign of the building model all the way down to the size, spacing, configuration and location of the reinforcing steel.

For example, based on a design parameter of 50 lb/sf live load, the DMES system 110 would design a end span beam with the following attributes: width 2'6"; depth 20¾"; reinforcing steel bottom 2—#11's; top east 6—#4's; top west 7—#11's; and #4 stirrups at 18" on center. If it was determined that the live load needed to increase to 80 lb/sf, the DMES system would redesign the beam to 3'0" wide and increase the reinforcing steel to: bottom 3—#11's; top east 4—#5's; top west 8—#11's; and #4 stirrups at 14" on center.

In a preferred embodiment, the foregoing information be electronically transmitted to a reinforcing steel supplier, thus enabling the fabrication process to begin immediately without awaiting final approval of the shop drawings, which can take several months, as is typically the case. Should the geometry of the building change, the above procedure is repeated and the new design is generated.

In another aspect, the DMES system is capable of detecting physical clashes between various components of the building model as the model is being automatically assembled and automatically redesign the model to relocate the affected component(s) to avoid the clash. In contrast to a conventional CAD tool, which uses software algorithms that scan and sort the locations and extents of all three-dimensional primitive geometries in a building model and compares all of the locations thereof for potential overlaps, the DMES system of the present invention performs clash detection, or interference checking, by cross checking the location and extents of the current instance against only those other existing instances in the model and adjusting its position if necessary before assembling it into the model. This automatic clash detection is part of the assembly process in each massing element and each element uses its own specific functions to determine the parameters of a clash and the rules by which to reposition the instance. This process has a small incremental impact on the speed of the assembly process, but completely removes the need for a series of long clash detection exercises after the model is complete.

An exemplary code block for performing such clash detection is set forth in Appendix D hereto. In particular, the function of this code block is to compare the position of the current light fixture against structural columns in the rectangular grid. The function is called from within the element assembly code block of the Light massing element 204g (FIG. 2a). The return values tell the assembly code of the Light massing element 204g how to place the light fixture-reposition up, reposition down, reposition left, reposition right, do not place at all, or ignore.

One unique application of the invention described herein is referred to as "rattling the box." In particular, different data, or parameter, sets for implementing multiple building configurations are input to the DMES system 110 along with incremental steps to vary them. Assembly of all of the resultant building models occurs automatically in sequence.

This assembly process runs in a memory device 180 of the computer on which the DMES system is installed, thus removing the need to continually redraw the graphics on the monitor and increasing exponentially the speed with which assembly can be accomplished. The process instead displays a dynamic graphical representation of the cost estimate data generated with respect to each of the resultant building models to enable comparisons to be made therebetween. The greater the number of design parameters varied in a "rattle the box" process, the more complex the interaction of the various cost estimate curves produced. This process not only allows many more design evaluations and comparisons to be carried out than by traditional methods, it also delivers optimized maxima and minima that would be impossible to predict by currently available methods.

The "rattling the box" process therefore allows for the accurate evaluation and comparison of cost estimate data associated with many different building models through dynamic iteration of one or more selected design parameters to determine the optimum design.

In one embodiment, the "rattle the box" process is implemented by wrapping the assembly functionality in the Interview massing element 202 (FIG. 2a) in a series of nested loops, each of which in turn increments one or more selected parameters. This forces the Interview massing element to assembles many building models, one after the other, with a variance of one or more of the design parameters in each iteration.

Figure 6A:
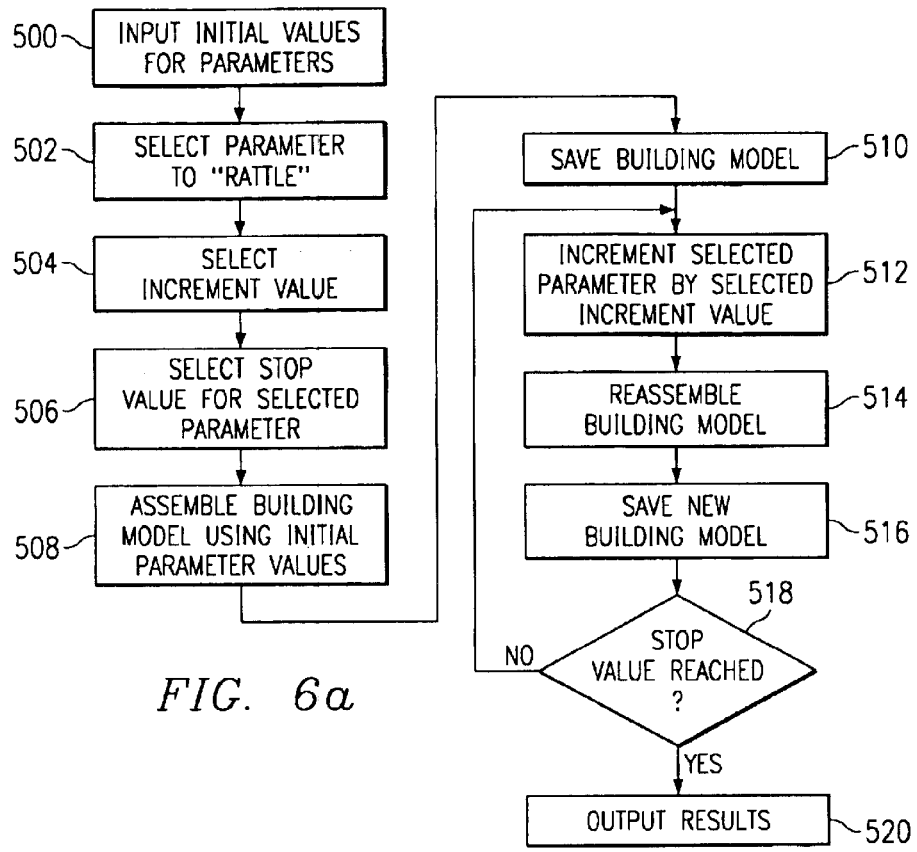
FIG. 6*a* is a flowchart of the operation of a "rattle the box" function of the DMES system of FIG. 1.

FIG. 6a is a flowchart illustrating the above-described process of rattling the box with respect to a selected parameter. In step 500, the initial values for all parameters are input to the DMES system 110 as described above. In step 502, a parameter to be incrementally changed is selected. Exemplary parameters include, but are not limited to, the angle of the building on the building site, the length-to-width ratio of the building, the number of floors, or the floor-to-floor height. Indeed, any one (or more) of the parameters input to the DMES system 110 may be selected. For the sake of example, it will be assumed for the remainder of the description of FIG. 6a that the selected parameter is the angle of the building on the building site and the initial value of the selected parameter is 0 degrees. In step 504, an increment value, e.g., 10 degrees, is selected. In step 506, a stop value for the selected parameter, e.g., 180 degrees, is selected. In step 508, the building model is assembled using the initial parameter values.

In step 510, the building model is saved. In step 512, the value of the selected parameter is incremented by the selected increment value. Using the above-noted example, the first time step 512 is executed, the value of the selected parameter would be incremented from 0 degrees to 10 degrees. In step 514, the building model is reassembled using the new value for the selected parameter. In step 516, the new building model is saved. In step 518, a determination is made whether the current value of the selected parameter is equal to the selected stop value. Again, using the above-noted example, the first time step 518 is executed, the current value of the selected parameter is 10 degrees, which is not equal to the selected stop value of 180 degrees. Accordingly, execution returns to step 512. If in step 518 it is determined that the current value of the selected parameter is equal to (or exceeds) the selected stop value, execution proceeds to step 520, in which the results are output, preferably in the form of a graph to enable a user quickly and easily to determine the cost maxima and minima.

It will be recognized that the flowchart shown in FIG. 6a illustrates a process in which only one parameter is selected and incremented, but that nested loops could be used to select any number of parameters to be incremented and the building model reassembled.

An exemplary code segment for implementing the "rattling the box" process is as follows:

```
//WHILE LOOP TO INCREMENTALLY CHANGE
THE BUILDING ROTATION ON THE SITE
    while(rotation < maxRotation)
    {
        //WHILE LOOP TO INCREMENTALLY CHANGE THE BUILD-
        ING PROPORTIONS WHILE
        //MAINTAINING THE REQUIRED NET AREA
        while(buildingwidth < minBuildingWidth)
        {
            buildingWidth = buildingArea/buildingLength
            do
            {
                //DO LOOP TO PLACE EACH MASSING ELEMENT
            INSTANCE
                num++
            } while(num < number)
                buildingLength += incrementalLength
        }
        buildingLength = originalBuildingLength
        rotation += incrementalRotation
    }
```

As previously indicated, this code segment is wrapped around the assembly do loop in the Interview massing element 201. The above-noted example specifically increments the rotation of the building on the site while incrementing the plan proportions of the building model while maintaining the building foot plate net area.

Figure 6B:
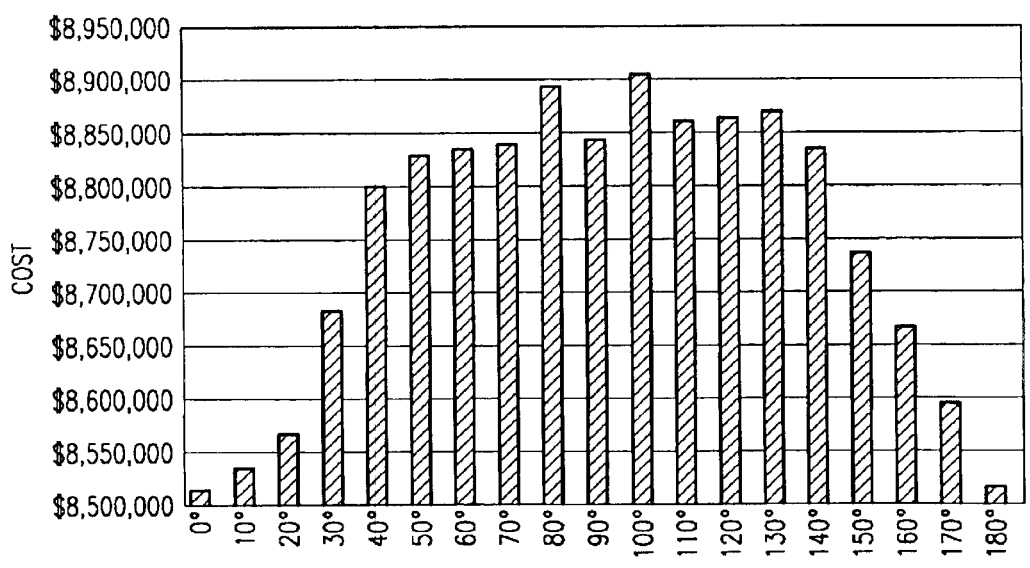
FIG. 6*b* is a graph generated using the "rattle the box" function of the DMES system of FIG. 1.

The results of the "rattling the box" process can be graphed so as to graphically illustrate a cost maxima and minima. For example, FIG. 6b illustrates a graph of the results of a "rattle the box" process where a building was rotated on the site by 10 degree increments and the cost thereof recalculated (i.e., the building model reassembled in the memory device 180 at each position.

In an alternative embodiment, the detailed design information may be entered into the DMES system via a manual graphical design interface, instead of through the element and massing element dialogs boxes, thus facilitating use of the DMES system by architects and engineers, who will typically be more comfortable with sketching their designs into the DMES system rather than typing data defining their designs into a multitude of dialog boxes and their input fields. The manual graphical design interface consists of a set of graphical tools which allow the designer to draw shapes and drag and drop symbols to represent the desired design layouts and configurations for things like building shape, room layouts and stair, elevator and restroom positioning. The data gathered by the manual graphical design interface is stored in external data files for use by the elements and massing elements when the DMES system is run.

Although an illustrative embodiment has been shown and described, a wide range of modification, change, and substitution is contemplated in the foregoing disclosure and in some instances, some features of the embodiment may be employed without a corresponding use of other features. Accordingly, it is appropriate that the appended claims be construed broadly and in a manner consistent with the scope of the embodiment disclosed herein.

APPENDIX A

MASSING ELEMENT PLACING CODE BLOCK

```
do
{
    //DO LOOP TO PLACE INSTANCES ALONG EACH
    SIDE OF BUILDING
    if(TASK == "assembly")
    {
        //PLACE THE CURRENT INSTANCE OF THE ELEMENT
        //GET LAYER HANDLE OF APPROPRIATE LAYER FOR
        THIS ELEMENT
        layerhandle = RewindLayer("Layer01")
        //PLACE THE CURRENT INSTANCE ON THE
        PLACEMENT LAYER
        obj = OBJplace(OBJECT1, layerhandle)
        //MOVE AND ROTATE THE CURRENT INSTANCE
        INTO POSITION
        OBJtranslate(obj, xpos, ypos, zpos)
        OBJrotate(obj, 0, 0, thisRot[thisSide])
        //RETURN THE UID OF THE CURRENT INSTANCE
        FROM ITS HANDLE
        NODE[num] = OBJgetuld(obj)
    }
    else if(TASK == "cost" || TASK == "estimate")
    {
        //CREATE A NEW TEMPORARY OBJECT IN MEMORY
        obj = OBJnew(OBJECT1)
    }
    //IF TASK IS ASSEMBLY OR COSTING
    if(TASK != "none")
    {
        //PASS THE DATA REQUIRED TO THE CURRENT
        INSTANCE
```

APPENDIX A-continued

MASSING ELEMENT PLACING CODE BLOCK

```
        OBJsetValueS(obj, "TASK", TASK, 0)
        OBJsetValueI(obj, "LENGTH", LENGTH, 0)
        OBJsetValueI(obj, "WIDTH", WIDTH, 0)
        OBJsetValueI(obj. "HEIGHT", HEIGHT, 0)
        OBJsetValueS(obj, "MATERIAL", MATERIAL, 0)
        //EXECUTE CALCULATION VIEW OF CURRENT
        INSTANCE
        OBJexecute(obj, "calculation")
    }
    //IF TASK IS ASSEMBLY
    if(TASK == "assembly")
    {
        //WRITE THE CURRENT INSTANCE TO THE
        DATABASE
        OBJwrite(obj)
        //REDRAW THE CURRENT INSTANCE ON SCREEN
        OBJredraw(obj)
        //REFRESH THE SCREEN TO SHOW THE CURRENT
        INSTANCE NOW
        RefreshAll( )
    }
```

APPENDIX A-continued

MASSING ELEMENT PLACING CODE BLOCK

```
        if(TASK != "none")
        {
            //GATHER AND ACCUMULATE VALUES FROM
            EACH INSTANCE
            AREA = OBJgetValueF(obj, "AREA", 0)
            VOLUME += PanelVolume+OBJgetValueF(obj,
            "VOLUME", 0)
            COST += OBJgetValueF(obj, "COST", 0)
        }
        else if(TASK == "cost" || TASK == "estimate")
        {
            //FREE UP TEMPORARY OBJECT IN MEMORY
            OBJfree(obj)
        }
        //INCREMENT THE INSTANCE NUMBER AND THE INSTANCE
        NUMBER ALONG THIS SIDE
        num++
        //END OF DO LOOP TO PLACE EACH INSTANCE ALONG
        EACH SIDE OF EACH FLOOR
    } while(num < number)
```

APPENDIX B

CODE BLOCK TO CALCULATE GIRDER REINFORCEMENT

```
//-------Girder weight per lf-----------------------------------
    If(nrow) > 1 && nrow < wnumbay + 1) girderdeadload = width * ttldepth * concretewt
    if(nrow ==1 || nrow == wnumbay + 1) girderdeadload = (extbeamwidth * ttldepth * concretewt) + SKINLOAD
    girderdeadload = girderdeadload * 1.4
    gdl = girderdeadload
//-------Calculate the previous row of joist dead loads in psf-----------------------------------
    nrow I=1 )
    {
        previousslabwt = depth * concretewt
        previousjoistwt = ((previousjoistwidth * joistdepth)/centers) * concretewt
        previousjoistdeadload = (previousslabwt + previousjoistwt +cig_mech_load +PARTLOAD) * 1.4
    }
//-------Calculate deadload of joist on girder-----------------------------------------------------
    girderdeadload = girderdeadload + (((previousjoistspan * .5 * previousjoistdeadload) + (joistspan * .5 * joistdeadload))
//-------Area that the girder supports-------------------------------------
    if(ncol ==1 || ncol == Inumbay) areasup = (wbaywidth*.5 + wprevious*.5 + width)* (Ipresent - extbeamwidth)
    if(ncol > 1 && ncol < Inumbay) areasup = (wbaywidth*.5 + wprevious*.5 + width) * Ipresent
//-------See if girder live load can be reduced by code reduction factor which = (area of support - 150) x .08, max 40%-----------
    girderliveload = (joistspan *liveload) + (previousjoistspan * previousliveload)) / (joistspan + previousjoistspan)
    float liveLoadWithOutReduce = ((joistspan + previousjoistspan) *.5 + width)* girderliveload
    reduce = (areasup - 150)* .08
    if(reduce < 10) girderliveload = girderliveload* 1.7
    if(reduce >= 10 && reduce < 40) girderliveload = (girderliveload - (girderliveload * reduce*.01))*1.7
    if(reduce >= 40) girderliveload = (girderliveload - (girderliveload* .4))*1.7
    gll = girderliveload
    girderliveload = ((joistspan + previousjoistspan) *.5 + width)* girderliveload
//-------Calculate Girder total loads (Wu) lb/ft -----------------------------------
    girderload = (girderliveload + girderdeadload)
//-------Calculate Girder moments in ft-kips-----------------------------------
    girderwestmoment = (girderload * Ipresent * Ipresent) / 160000
    girdermiddlemoment = 0
    girdereastmoment = (girderload * Ipresent Ipresent) / 160000
    if(ncol == 1 || ncol == Inumbay)
    {
        if(ncol != 1) girderwestmoment = (girderload * Ipresent * Ipresent) / 10000
        girdermiddlemoment =(girderload * Ipresent * Ipresent) / 11000
        if (ncol != Inumbay) girdereastmoment = (girderload * Ipresent * Ipresent) / 10000
    }
    if(ncol) > 1 && ncol < Inumbay)
    {
        girderwastmoment = (girderload * Ipresent * Ipresent) / 11000
        girdermiddlemoment = (girderload * Ipresent * Ipresent) / 16000
        girdereastmoment = girderwestmoment
    }
```

APPENDIX B-continued

CODE BLOCK TO CALCULATE GIRDER REINFORCEMENT

```
//-------Calculate Girder stirrup rebar area---------------------------------
    compressionwidth = width
    integer codespacing = 24
    shearultimate = (girderload * Ipresent / 2)
    shearcritical = shearultimate - (girderload * rebardepth)
    concreteshear = 2 * sqrt(constrength * 144 * compressionwidth * rebardepth)
    steelshear = shearultimate/.85 - concreteshear
    stirrupdistance = (Ipresent /2) - ((.85 * concreteshear/2) * (1 / girderload))
    areasteel = .11 * 4
    stirrupspacing = ((areasteel * constrength * rebardepth*12) / steelshear) + .95
    If(rebardepth*12 / 2 < codespacing) codespacing = (rebardepth*12 / 2)
    if(((areasteel * steelyield * rebardepth*12) / (50 * compressionwidth)) < codespacing) codespacing = ((areasteel * steelyield *
rebardepth*12) / (50 * compressionwidth))
    gspacing = maxspacing + .9
    gfirstspace = gspacing / 2
    gtotalstirrup = ((stirrupdistance - gfirstspace) / maxspacing) + .95
//-------Calculate bottom Girder rebar area----------------------------------
    rebararea = 0
    compressionwidth = width
    moment = girdermiddlemoment
    w = (1.695-sqrt(1.695*1.695-((6.78*moment)/(.9*constrength*.144*compressionwidth*rebardepth*rebardepth))))/2
    rebararea = (w * (constrength/steelyield) * compressionwidth * rebardepth) * 144
    botgrebararea = rebararea
//-------Calculate top Girder rebar area-------------------------------------
    integer tb = 1
    do
    {
        compressionwidth = width
        topbarlength = 0
        w = (1.695-sqrt(1.695*1.695-((6.78*moment)/(.9*constrength*.144*compressionwidth*rebardepth*rebardepth))))/2
        rebararea = (w * (constrength/steelyield) * compressionwidth * rebardepth) * 144
        //Use Only 30% of maximum moment ReInforcing if moment = 0
        if(tb == 1 && girderwestmoment I= 0) topgwrebararea = rebararea
        if(tb == 2 && girdereastmoment I= 0) topgerebararea = rebararea
        tb++
    } while (tb <= 2)
    //Check to make sure at least 30% of the maximum top rebar area is used
    if(topgwrebararea * .33333 > topgerebararea) topgerebararea = topgwrebararea * .33333
    If(topgerebararea * .33333 > topgwrebararea) topgwrebararea = topgerebararea * .33333
```

APPENDIX C

CODE BLOCK TO READ GLASS SOLAR GAIN EXTERNAL FILE AND CREATE TABLE

```
void readGlassFile( )
{
//DECLARE LOCAL VARIABLES
    integer readMonth = 0
    integer readDegree = 0
    integer readDirection = 0
    integer readHour = 0
    integer countDir = 0
    integer countHour = 0
    integer count = 0
    integer monthNumber = 0
    string month = " "
    string degree = " "
    string direction = " "
    string strMonth = MONTH
    string sgtemp = " "
    integer cr = 0
    character charTemp
//WHILE LOOP TO EXTRACT THE VALUES FROM CONTENT
(IGNORING THE FIRST LINE OF THE FILE)
while(count < stringLength)
{
    //SELECT ONE CHARACTER AT A TIME
    temp = STRsubstr(content, count, count + 1)
    charTemp = STRchar(temp,0)
    //SET cr= TO TRUE IF CHARACTER IS A RETURN
    cr = STRiscr(charTemp)
```

APPENDIX C-continued

CODE BLOCK TO READ GLASS SOLAR GAIN EXTERNAL FILE AND CREATE TABLE

```
//TURN ON/OFF ITEMS FOR READING
if(readMonth && temp == ",") { readMonth = 0 ; readDegree = 1 }
if(readMonth) month = month + temp
monthNumber = month
if(monthNumber > MONTH) break
if(month== strMonth)
{
    if(readDegree && cr) {readDegree = 0 ; readDirection = 1 ;
    countDir = 0 }
    if(readDegree && temp I= ",") degree = degree + temp
        if(degree == strlat1 || degree == strlat2)
        {
            if(readDirection && temp == ",") { readDirection = 0 ;
            readHour = 1 ;
            countHour = 0 }
            //READ CHARACTERS INTO VARIABLES NAMES
            if(readDirection && I cr) direction = direction + temp
            if(readHour)
            {
                if(temp I= && temp I= && I cr) sgtemp = sgtemp + temp
            }
            If(readHour && (temp == "," || cr))
            {
                if(degree == strlat1)
                {
                    GlassSG1[countDir][countHour] sgtemp
                }
```

APPENDIX C-continued

CODE BLOCK TO READ GLASS SOLAR GAIN EXTERNAL FILE AND CREATE TABLE

```
            if(degree == strlat2)
            {
                GlassSG2[countDir][countHour] = sgtemp
            }
            sgtemp = " "
            countHour++
        }
        if(readHour && cr ) { readHour = 0 ; readDirection = 1 ;
        direction = " "; countDir++ }
    }
}
if(temp == "#")
{
        readMonth = 1
        readDegree = 0
        month = " "
        degree = " "
}
    count++
}   //END OF WHILE LOOP TO EXTRACT CONTENTS
countDir = 0
float firstSG = 0
float secondSG = 0
integer tempSG = 0
integer sgCounter = 0
do
{
    countHour = 0
    do
    {
        //CALCULATE THE SOLAR GAIN AT THE GIVEN
        LATITUDE
        firstSG = GlassSG1[countDir][countHour]
        secondSG = GlassSG2[countDir][countHour]
        tempSG = firstSG-(((firstSG-secondSG) /
        12)*(LATITUDE-lat1)) + 0.9
        GlassSG[MONTH][sgCounter] = tempSG
        sgCounter++
        countHour++
    } while (countHour < 12)
    countDir++
} while (countDir < 9)
}
```

APPENDIX D

Clash Detection Code Block

```
//FUNCTION TO TEST POSITION OF LIGHT FIXTURE AGAINST STRUCTURAL COLUMNS
//(PASSED X AND Y POSITION OF LIGHT AND FLOOR NUMBER)
integer testPos(float xposition, float yposition, Integer flr)
{
//DECLARE TEMPORARY VARIABLES
    float xmin = 0
    float ymin = 0
    float xmax = 0
    float ymax = 0
    float bayWid = 0
    float bayDep = 0
//DECLARE TEMPORARY VARIABLES FOR COLUMNS
    Integer h = 0
    Integer v = 0
    float colWid = COLUMNMINSIZE
    float colDep = COLUMNMINSIZE
//TEST FOR CLASH WITH EACH COLUMN
    do    //DO LOOP TO TEST HORIZONTAL COLUMN POSITIONS
    {
        bayWid = ColumnX[h]    //CAPTURE THE X POSITION OF THE COLUMN
        xmin = (bayWid-colWid/2-OFFSET-light_length/2)    //MIN CLEARANCE
        xmax = (bayWid+colWid/2+OFFSET+light_length/2)    //MAX CLEARANCE
        //TEST FOR HORIZONTAL CLASH WITH COLUMN
        if((xposition >= xmin) && (xposition <= xmax))
        {
            do    // DO LOOP TO TEST VERTICAL COLUMN POSITIONS
            {
                bayDep = ColumnY[v]    //CAPTURE THE Y POSITION OF THE COLUMN
                ymin = (bayDep-colDep/2-OFFSET-light_width/2)    //MIN CLEARANCE
                ymax = (bayDep+colDep/2+OFFSET+light_width/2)    //MAX CLEARANCE
                //TEST FOR HORIZONTAL CLASH WITH COLUMN
                If((yposition >= ymin) && (yposition <= ymax))
                {
                    //RETURN VALUE OF 2 OR 3 FOR CONFLICT WITH COLUMN
                    if(lightOffset == "vert")    //REPOSITION VERTICALLY
                    {
                        If(yposition > ymin+(ymax-ymin)/2) return(2)
                        else return(3)
                    }
```

APPENDIX D-continued

Clash Detection Code Block

```
            else if(lightOffset == "horz")   //REPOSITION HORIZONTALLY
            {
                    if(xposition > xmin+(xmax-xmin)/2) return(2)
                    else return(3)
            }
        }
        v++
    } while(v < NUMBAYS[1])
    }
    h++
    bayDep = 0
    v = 0
} while(h < NUMBAYS[ ])
//RETURN VALUE OF ONE FOR NO CONFLICT
    return(1)
}
```

What is claimed is:

1. A computer-implemented automated building design and modeling system comprising:

a spatial database;

means for defining parametric objects wherein each of the parametric objects represents a construction component of a building being modeled and together the parametric objects describe information sufficient for assembly of a complete building model for the building's construction as constrained by the input of selected client requirements, and further wherein each of the parametric objects includes an interface through which the parametric object communicates information with other parametric objects;

a user interface for user input of selected client requirements to specify a configuration of the building model; and means for initiating automatic assembly of the building model utilizing the defined parametric objects, whereby the parametric objects for the building model are created in the spatial database and customized based upon the client requirements entered via the user interface; and whereby the parametric objects communicate information via their interfaces to assemble the building model, wherein said objects comprise ordinary elements and massing elements, said massing elements being capable of placing instances of other objects into the spatial database and subsequently passing data thereto and receiving data therefrom.

2. The system of claim 1 wherein said ordinary elements and massing elements are assembled into said building model according to a sequential assembly hierarchy.

3. The system of claim 1 wherein said means for initiating automatic assembly comprises a massing element.

4. The system of claim 1 wherein said user interface comprises a dialog box.

5. The system of claim 1 wherein each of said massing elements comprises:

means for detecting a physical clash between an existing instance of an object and an instance of an object currently being placed by said massing element; and means for avoiding the detected physical clash by automatically relocating said instance of an object currently being placed according to predefined placement rules.

6. A computer program product, comprising:

a computer program processable by a computer system for causing the computer system to:

create instances of parametric objects in a spatial database, wherein each of said parametric objects represents a construction component of a structure to be modeled and includes a user interface for enabling a user to input design data to said parametric object; and initiate automatic assembly of said parametric objects to create a building model, wherein said objects comprise ordinary elements and massing elements, said massing elements being capable of placing instances of other objects into the spatial database and subsequently passing data thereto and receiving data therefrom.

7. The computer program product of claim 6 wherein said computer program further causes the computer system to create a graphical representation of said building model.

8. The computer program product of claim 7 wherein said graphical representation is selected from the group consisting of design development drawings, specifications, construction drawings, shop drawings, and details.

9. The computer program products of claim 6 wherein said computer program further causes the computer system to create a cost estimate for said structure from said building model.

10. The computer program product of claim 6 wherein said computer program further causes the computer system to create a construction schedule for said structure from said building model.

11. The computer program product of claim 6 wherein said ordinary elements and massing elements are assembled into said building model according to a sequential assembly hierarchy.

12. The computer program product of claim 6 wherein said user interface comprises a dialog box.

13. The computer program product of claim 12 wherein each of said massing elements comprises:

computer program code for detecting a physical clash between an existing instance of an object and an instance of an object currently being placed by said massing element; and computer program code for avoiding the detected physical clash by automatically relocating said instance of an object currently being placed according to predefined placement rules.

14. The computer program product of claim 6 wherein said computer program further causes the computer system to:

initially assemble said building model using an initial value for at least one selected parameter of said structure;

save results of said initial assembling;

increment said initial value by a selected amount;

reassemble said building model using said incremented initial value for said at least one selected parameter;

save results of said reassembling;

repeat said incrementing, reassembling and saving results of said reassembling until a value for said at least one selected parameter is equal to a selected final value; and provide said saved results to a user.

15. The computer program product of claim 14 wherein said saved results are provided to said user in the form of a graph.

16. The computer program product of claim 6 wherein each of said objects includes an internal interface for enabling said object to interact with other ones of said objects.

17. A computer program product, comprising:

a computer program processable by a computer system for causing the computer system to:

create instances of parametric objects in a spatial database, wherein each of said parametric objects represents a construction component of a structure to be modeled and includes a user interface for enabling a user to input design data to said parametric object, and initiate automatic assembly of said parametric objects to create a building model, wherein one of said objects is a grouping massing element, said grouping massing element specifying parametric behavior required of objects that it assembles in said building model, which objects may be either parametric or non-parametric.

18. A method of implementing a computer-implemented automated building design and modeling system, the method comprising:

defining parametric objects wherein each of the parametric objects represents a construction component of a building being modeled and together the parametric objects describe information sufficient for assembly of a complete building model for the building's construction as constrained by the input of selected client requirements, and further wherein each of the parametric objects includes an interface through which the parametric object communicates information with other parametric objects;

inputting selected client requirements to specify a configuration of the building model; and automatically assembling the building model utilizing the defined parametric objects, whereby the parametric objects for the building model are created in a spatial database and customized based upon the inputted client requirements; and whereby the parametric objects communicate information via their interfaces to assemble the building model, wherein said objects comprise ordinary elements and massing elements, the method further comprising said massing elements placing instances of other objects into the spatial database and subsequently passing data thereto and receiving data therefrom.

19. The method of claim 18 further comprising generating a comparison representation of selected information pertaining to variations of the assembled building model.

20. The method of claim 19 wherein said representation is created by:

saving the results of an initial assembling of the building model that utilizes an initial value for at least one selected parameter of the building;

changing the initial value for the at least one selected parameter by a selected amount, reassembling the building model, and saving the new results;

repeating the changing, reassembling, and saving for a selected number for variations of the building model; and outputting a comparison representation of selected information for the reassembled building models represented by the saved results.

21. The method of claim 19 wherein the variations of the assembled building model relate to the building's orientation on its site and the selected information of the comparison representation illustrates the building cost for each such variation in building orientation.

22. The method of claim 18 wherein the parametric objects further describe construction cost information, the method further comprising creating a cost estimate for said structure from said building model.

23. The method of claim 18 wherein the parametric objects further describe construction cost information, the method further comprising creating a construction schedule for said structure from said building model.

24. The method of claim 18 wherein said ordinary elements and massing elements are assembled into said building model according to a sequential assembly hierarchy.

25. The method of claim 18 wherein said inputting is performed utilizing a user interface that comprises a dialog box.

26. The method of claim 18 further comprising, for each object that is created in the spatial database:

detecting a physical clash between an existing instance of an object and an instance of an object currently being placed by said massing element; and avoiding the detected physical clash by automatically relocating said instance of an object currently being placed according to predefined placement rules.

27. The method of claim 18 further comprising:

initially assembling said building model using an initial value for at least one selected parameter of said structure;

saving results of said initial assembling;

incrementing said initial value by a selected amount;

reassembling said building model using said incremented initial value for said at least one selected parameter;

saving results of said reassembling;

repeating said incrementing, reassembling and saving results of said reassembling until a value for said at least one selected parameter is equal to a selected final value; and providing said saved results to a user.

28. The method of claim 27 wherein said saved results are provided to said user in the form of a graph.

* * * * *

UNITED STATES PATENT AND TRADEMARK OFFICE
CERTIFICATE OF CORRECTION

PATENT NO. : 6,859,768 B1
DATED : February 22, 2005
INVENTOR(S) : Wakelam et al.

It is certified that error appears in the above-identified patent and that said Letters Patent is hereby corrected as shown below:

Title page,
Item [73], Assignee, should read as follows:
-- Beck Technology, Dallas, Texas --

Column 9,
Line 48, please delete the word "we".
Line 55, please delete the word "in".

Signed and Sealed this

Twenty-fourth Day of May, 2005

JON W. DUDAS
*Director of the United States Patent and Trademark Office*